(12) United States Patent
Lee et al.

(10) Patent No.: US 9,478,548 B2
(45) Date of Patent: Oct. 25, 2016

(54) SEMICONDUCTOR DEVICES AND METHODS OF MANUFACTURING SEMICONDUCTOR DEVICES

(71) Applicant: SAMSUNG ELECTRONICS CO., LTD., Suwon-Si, Gyeonggi-Do (KR)

(72) Inventors: Do-Yeong Lee, Gwangmyeong-Si (KR); Chan-Sic Yoon, Anyang-Si (KR); Ki-Seok Lee, Busan (KR); Hyeon-Ok Jung, Daejeon (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/639,360

(22) Filed: Mar. 5, 2015

(65) Prior Publication Data

US 2016/0035731 A1 Feb. 4, 2016

(30) Foreign Application Priority Data

Aug. 4, 2014 (KR) ........................ 10-2014-0099755

(51) Int. Cl.
*H01L 27/108* (2006.01)
*H01L 21/8242* (2006.01)
*H01L 29/78* (2006.01)
*H01L 21/28* (2006.01)
(Continued)

(52) U.S. Cl.
CPC ..... *H01L 27/10823* (2013.01); *H01L 21/0214* (2013.01); *H01L 21/0217* (2013.01); *H01L 21/02164* (2013.01); *H01L 21/31111* (2013.01); *H01L 21/31144* (2013.01); *H01L 27/10814* (2013.01); *H01L 27/10855* (2013.01); *H01L 27/10885* (2013.01); *H01L 27/10888* (2013.01); *H01L 29/4236* (2013.01)

(58) Field of Classification Search
CPC .............. H01L 27/10855; H01L 27/10876; H01L 27/10894; H01L 21/76897; H01L 27/10888
USPC ......... 257/296, 300, E27.084, 334; 438/381, 438/585, 586
See application file for complete search history.

(56) References Cited

U.S. PATENT DOCUMENTS 7,358,144 B2  4/2008  Im
8,129,239 B2  3/2012  Jung
(Continued)

FOREIGN PATENT DOCUMENTS

KR  1020080000833 A  1/2008
KR  1020090090712 A  8/2009
(Continued)

*Primary Examiner* — Kimberly Rizkallah
*Assistant Examiner* — Brian Turner
(74) *Attorney, Agent, or Firm* — Volentine & Whitt, PLLC

(57) ABSTRACT

A method of manufacturing a semiconductor device includes forming an isolation pattern on a substrate to define active patterns each having a first contact region at a center portion thereof and second and third contact regions at edge portions thereof. The method further includes forming a buried gate structure at upper portions of the isolation pattern and the active patterns, forming a first insulation layer on the isolation pattern and the active patterns, and etching a portion of the first insulation layer and an upper portion of the first contact region to form a preliminary opening exposing the first contact region. The method still further includes etching the isolation pattern to form an opening, forming an insulation pattern on a sidewall of the opening, and forming a wiring structure contacting the first contact region in the opening.

14 Claims, 37 Drawing Sheets

(51) Int. Cl.
  *H01L 21/311* (2006.01)
  *H01L 21/02* (2006.01)
  *H01L 29/423* (2006.01)

(56) References Cited

U.S. PATENT DOCUMENTS 8,319,264 B2 11/2012 Kim

2012/0211861 A1 8/2012 Nishihara
2013/0009226 A1* 1/2013 Park .................. H01L 27/10855
                                                    257/296
2014/0061737 A1 3/2014 Hsu et al.

FOREIGN PATENT DOCUMENTS

KR      10-972911 B    7/2010
KR      10-1096190     12/2011

* cited by examiner

SECOND
DIRECTION
↑  ↙ THIRD
    DIRECTION
   → FIRST
     DIRECTION

SEMICONDUCTOR DEVICES AND METHODS OF MANUFACTURING SEMICONDUCTOR DEVICES

CROSS-REFERENCE TO RELATED APPLICATION

A claim of priority under 35 USC §119 is made to Korean Patent Application No. 10-2014-0099755, filed on Aug. 4, 2014 in the Korean Intellectual Property Office (KIPO), the contents of which are herein incorporated by reference in their entirety.

BACKGROUND

Example embodiments relate to semiconductor memory devices. More particularly, example embodiments relate to methods of manufacturing semiconductor devices such as dynamic random access memory (DRAM) devices.

DRAM and other memory device fabrication has been characterized by continued increases in device integration. One necessary aspect of realizing highly integrated devices resides in the formation of wiring structures having extremely small dimensions. In particular, it is necessary to minutely form contact plugs and conductive lines of such wiring structures.

SUMMARY

According to example embodiments, there is a method of manufacturing semiconductor devices having a wiring structure. In the method, an isolation pattern is formed on a substrate to define a plurality of active patterns which are spaced apart from each other. Each of the active patterns has a first contact region at a center portion thereof and second and third contact regions at edge portions thereof. A buried gate structure is formed at upper portions of the isolation pattern and the active patterns, and the buried gate structure extends in a first direction. A first insulation layer is formed on the isolation pattern and the active patterns. A portion of the first insulation layer on the first contact region and an upper portion of the first contact region thereunder are etched to form a preliminary opening exposing at least the first contact region. The isolation pattern exposed by a sidewall of the preliminary opening is etched to form an opening, and a sidewall of the opening exposes the active patterns and the buried gate structure. An insulation pattern is formed on the sidewall of the opening to form a plurality of openings which are spaced apart from each other. A wiring structure contacting the first contact region is formed in the opening, and the wiring structure has a width in the first direction smaller than that of the opening.

In example embodiments, the buried gate structures may be formed to divide the first, second and the third contact regions from each other in each of the active patterns.

In example embodiments, each of the active patterns may extend in a third direction that is not perpendicular to the first direction. The first contact region of each of the active patterns may be disposed in a space defined by sidewalls of the active patterns and sidewalls of neighboring two buried gate structures disposed in a second direction substantially perpendicular to the first direction.

In example embodiments, etching the isolation pattern exposed by the sidewall of the preliminary opening to form the opening may include the etching the isolation pattern, so that sidewalls of the neighboring two active patterns in the first direction may be exposed by the sidewall of the opening.

In example embodiments, etching the isolation pattern exposed by the sidewall of the preliminary opening to form the opening may include an isotropic etching process.

In example embodiments, when the insulation pattern is formed, a second insulation layer may be formed on an inner wall of the opening and the first insulation layer to electrically insulate each of the active patterns from the buried gate structure. The second insulation layer may be anisotropically etched.

In example embodiments, the insulation pattern may be formed to include silicon nitride, silicon oxynitride or silicon oxide.

In example embodiments, a first conductive layer may be further formed on the first insulation layer.

In example embodiments, when the wiring structure is formed, a conductive layer may be formed to fill the opening, and the conductive layer may be partially etched to form the wiring structure at an inside of the opening.

In example embodiments, an upper portion of the wiring structure may be formed to have a linear shape extending in a second direction substantially perpendicular to the first direction.

In example embodiments, when the preliminary opening is formed, a plurality of etching masks which are spaced apart from each other may be formed on the first insulation layer, and the etching masks may overlap the second and third contact regions and a portion of the isolation pattern adjacent to the second and third contact regions. The first insulation layer may be etched using the etching masks.

In example embodiments, when the preliminary opening is formed, a mask may be formed on the first insulation layer, and the mask may include a hole exposing the first contact region. The first insulation layer may be etched using the mask.

According to example embodiments, there is a method of manufacturing semiconductor devices having a wiring structure. In the method, an isolation pattern is formed on a substrate to define a plurality of active patterns including a contact region. A plurality of buried structures is formed at upper portions of the active patterns and the isolation pattern, and the buried gate structures extend in a first direction. A first insulation layer is formed on the isolation pattern and the active patterns. A portion of the first insulation layer on the contact region and an upper portion of the contact region thereunder are etched to form a preliminary opening exposing at least the contact region and having a first width in the first direction. The isolation pattern exposed by a sidewall of the preliminary opening is etched to form an opening, the opening having a second width in the first direction greater than the first width. An insulation pattern is formed on the sidewall of the opening. A wiring structure contacting the contact region is formed in the opening, and the wiring structure has a third width in the first direction smaller than the second width.

In example embodiments, etching the isolation pattern exposed by the sidewall of the preliminary opening to form the opening may include etching the isolation pattern so that sidewalls of neighboring two active patterns in the first direction are exposed by the sidewall of the opening.

In example embodiments, etching isolation pattern on sidewall of the preliminary opening to form the opening may include an isotropic etching process.

According to example embodiments, there is provided a semiconductor device. The semiconductor device includes a plurality of active patterns on a substrate. Each of the active patterns have a first contact region at a center portion thereof and second and third contact regions at edge portions thereof, and a top surface the first contact region is lower than those of the second and third contact regions. An isolation pattern is disposed between the active patterns. A buried gate structure is at upper portions of the isolation pattern and the active patterns, and the buried gate structure extends in a first direction. An insulation layer structure covers the second and third contact region and having an opening. The first contact region is exposed by a bottom of the opening, and the active patterns and the buried gate structures are exposed by a sidewall of the opening. An insulation pattern is on the isolation pattern and the active patterns. A wiring structure contacting the first contact region is in the opening, and the wiring structure has a width in the first direction smaller than that of the opening.

In example embodiments, the insulation pattern may include silicon nitride, silicon oxynitride, silicon oxide or air.

In example embodiments, the insulation pattern may have a closed line shape so that the insulation pattern may be electrically insulated a side of each of the active patterns from the buried gate electrode.

In example embodiments, a second insulation pattern may further formed between the insulation pattern on the sidewall of the opening and the wiring structure.

In example embodiments, an upper portion of the wiring structure may extend in a second direction substantially perpendicular to the first direction.

BRIEF DESCRIPTION OF THE DRAWINGS

Example embodiments will be more clearly understood from the detailed description that follows taken in conjunction with the accompanying drawings, which represent non-limiting, example embodiments as described herein. In the drawings.

DETAILED DESCRIPTION

Figure 1:
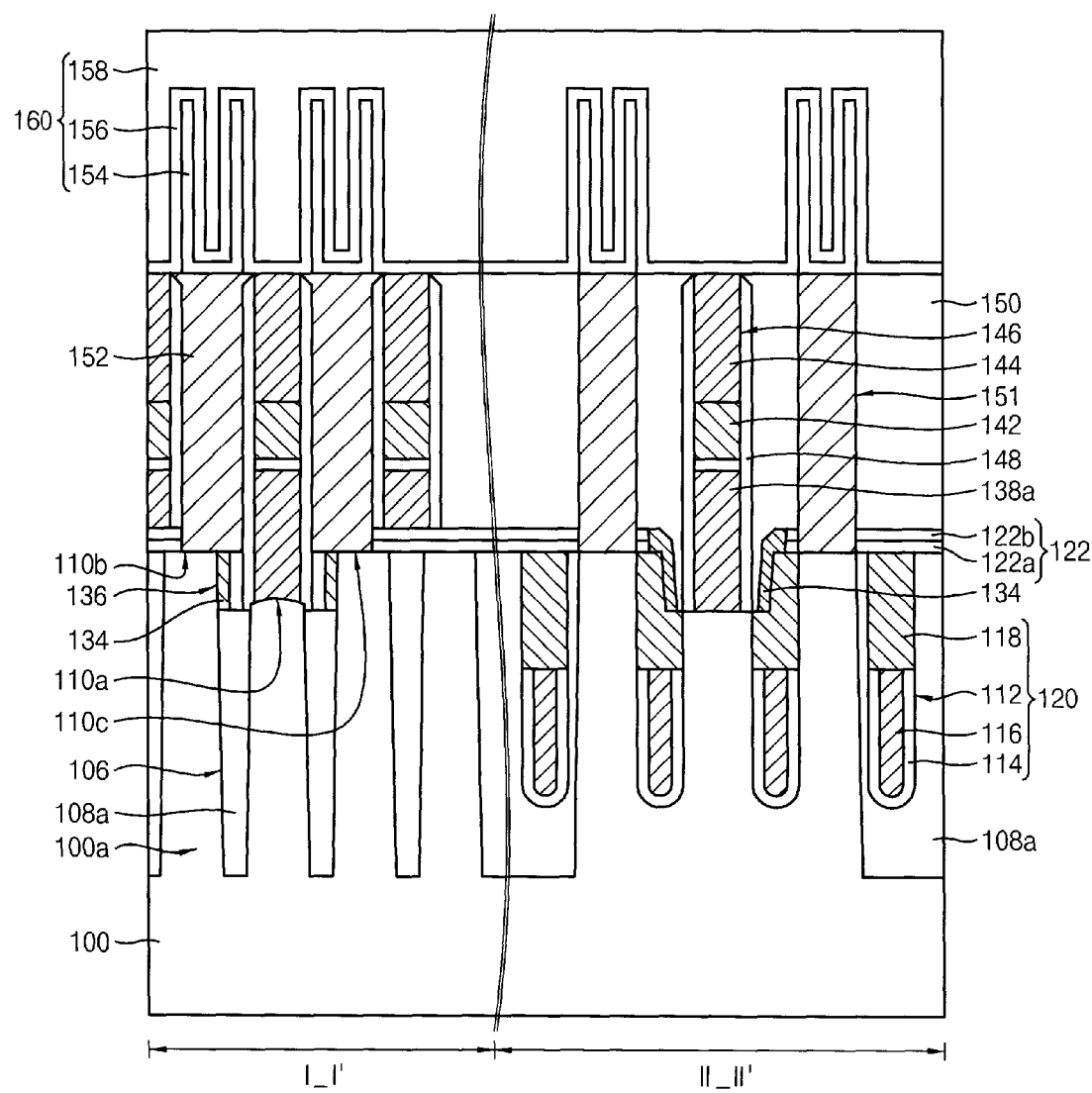
FIGS. 1 and 2 are a cross-sectional view and a plan view illustrating a semiconductor device in accordance with example embodiments.

Example embodiments will now be described more fully with reference to the accompanying drawings, in which example embodiments are shown. Example embodiments may, however, be embodied in many different forms and should not be construed as limited to the example embodiments set forth herein. In the drawings, the thicknesses of layers and regions are exaggerated for clarity. Like reference numerals in the drawings denote like elements, and thus their description will be omitted.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms first, second, third, etc. may be used herein to describe various elements, components, regions, layers and/or sections, these elements, components, regions, layers and/or sections should not be limited by these terms. Unless indicated otherwise, these terms are only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
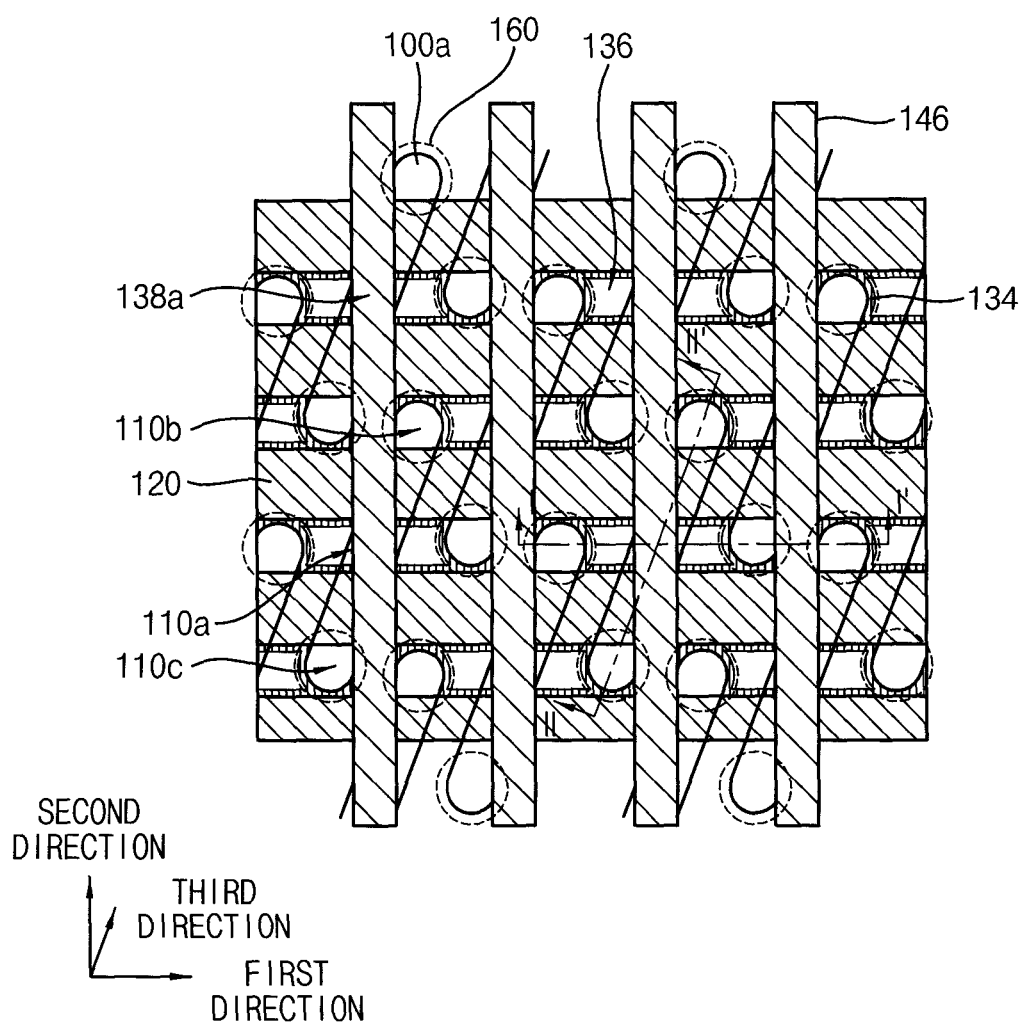

FIGS. 1 and 2 are a cross-sectional view and a plan view illustrating a semiconductor device in accordance with example embodiments.

FIG. 1 depicts cross-sections cut along lines I-I' and II-II' of FIG. 2.

Referring to FIGS. 1 and 2, the semiconductor device may include a substrate 100, active patterns 100a, an isolation pattern 108a, a buried gate structure 120, a bit line structure 146, a storage node contact 152 and a capacitor 160. Hereinafter, a direction in which the buried gate structure 120 extends may be referred to as a first direction, and a direction in which the bit line structure 146 extends may be referred to as a second direction, which may be substantially perpendicular to the first direction.

The substrate 100 and the active patterns 100a may include, e.g., single crystalline silicon. The active patterns 100a may be formed by etching upper portions of the substrate 100. Each of the active patterns 100a may protrude from the substrate 100, and may have a pillar shape.

The isolation pattern 108a may fill a trench between the active patterns 100a. The isolation pattern 108a may include an insulation material, e.g., silicon oxide. Each of the active patterns 100a may serve as an active region.

Each of the active patterns 100a may extend in a third direction that may be perpendicular neither to the first direction nor to the second direction. That is, the third direction may form an acute angle with each of the first and second directions. The active patterns 100a may be arranged in the third direction.

Each of the active patterns 100a may include a first contact region 110a at a central portion thereof, and second and third contact regions 110b and 110c at edge portions thereof. The first contact region 110a may be electrically connected to the bit line structure 146, and the second and third contact regions 110b and 110c may be electrically connected to the capacitors 160, respectively.

The first contact region 110a of one of the active patterns 100a may be close to the second contact region 110b of another one of the active patterns 100a adjacent thereto in the first direction, and also close to the third contact region 110c of another one of the active patterns 100a adjacent thereto in the first direction.

The buried gate structure 120 may be formed at each of the active patterns 100a, and may extend in the first direction. In example embodiments, a plurality of buried gate structures 120 may be formed, and e.g., one of the buried gate structures 120 may be formed between the first and second contact regions 110a and 110b, and another one of the buried gate structures 120 may be formed between the first and third contact regions 110a and 110c. The two buried gate structures 120 may be formed in parallel with each other in each of the active patterns 100a. The first, second and third contact regions 110a, 100b and 110c may be divided by the buried gate structures 120.

In each of the active patterns 100a, a top surface of the first contact region 110a may be lower than those of the second and third contact regions 110b and 110c. That is, in each of the active patterns 100a, the first contact region 110a may be a relatively recessed region.

The buried gate structure 120 may include a gate insulation layer 114, a gate electrode 116, and a first hard mask 118. The gate insulation layer 114 may include, e.g., silicon oxide. The gate electrode 116 may include a barrier pattern (not shown) and a metal pattern (not shown). The buried gate structure 120 may be formed in a gate trench 112 on the active patterns 100a and the isolation pattern 108a.

A first insulation layer structure 122 may be formed on the substrate 100. In example embodiments, the first insulation layer structure 122 may include at least two stacked layers. For example, the first insulation layer structure 122 may include a pad insulation layer 122a and an etch stop layer 122b sequentially stacked. The pad insulation layer 122a may include an oxide, e.g., silicon oxide, and the etch stop layer 122b may include a nitride, e.g., silicon nitride. Alternatively, the first insulation layer structure 122 may include a single layer containing, e.g., silicon oxide.

A first opening 136 may be formed through the first insulation layer structure 122 to expose the first contact region 110a. The first insulation layer structure 122 may cover the second and third contact regions 110b and 110c.

The first opening 136 may be defined by sidewalls of the active patterns 100a and sidewalls of neighboring buried gate structures 120 disposed in the second direction. Particularly, the first opening 136 may be defined by a first sidewall of one of the active patterns 100a at which the second contact region 110b is formed, by a second sidewall of another one of the active patterns 100a at which the third contact region 110c is formed, which may be adjacent to the first sidewall in the first direction, and by the sidewalls of neighboring buried gate structures 120 disposed in the second direction. Thus, the first opening 136 may expose the first contact region 110a and the isolation pattern 108a adjacent thereto.

A top surface of the isolation pattern 108a exposed by the first opening 136 may be substantially coplanar with that of the first contact region 110a, or lower than that of the first contact region 110a. Thus, the top surface of the isolation pattern 108a exposed by the first opening 136 may be lower than top surfaces of the second and third contact regions 110b and 110c.

An insulation pattern 134 may be formed at a sidewall of the first opening 136. The insulation pattern 134 may be conformally formed on the exposed sidewalls of the active patterns 100a and the exposed buried gate structures 120 by the first opening 136. The insulation pattern 134 may fill a gap between each of the active patterns 100a and the buried gate structure 120. Thus, the insulation pattern 134 may electrically insulate each of the active patterns 100a from the buried gate structure 120.

In plan view, the insulation pattern 134 may have a closed line shape. Thus, the first opening 136 may have an island shape defined by the insulation pattern 134. The insulation pattern 134 may include, e.g., silicon oxide, silicon nitride, or silicon oxynitride.

The bit line structure 146 may include a contact pattern 138a directly contacting the first contact region 110a, a bit line 142 on the contact pattern 138a, which may extend in the second direction, and a hard mask 144 on the bit line 142. The contact pattern 138a may include, e.g., polysilicon, and the bit line 142 may include, e.g., a metal.

Spacers 148 may be formed on sidewalls of the bit line structure 146. The spacers 148 may include, e.g., silicon nitride. Alternatively, the spacers 148 may be air spacers.

An insulating interlayer 150 may cover the bit line structure 146. The insulating interlayer 150 may fill a gap between the insulation pattern 134 on the sidewall of the first opening 136 and the bit line structure 146.

A plurality of storage node contacts 152 may be formed through the insulating interlayer 150, and may contact the second and third contact regions 110a and 110b, respectively. The storage node contacts 152 may include, e.g., polysilicon or a metal.

A plurality of capacitors 160 may be formed on the storage node contacts 152, respectively. Each of the capacitors 160 may be a cylindrical capacitor or a pillar shaped capacitor.

FIGS. 3 to 24 are cross-sectional views and plan views illustrating stages of a method of manufacturing the semiconductor device of FIG. 1.

Particularly, FIGS. 3, 5, 7, 8, 10, 12, 14, 15, 17, 19, 21 and 23 are cross-sectional views, and FIGS. 4, 6, 9, 11, 13, 16, 18, 20, 22 and 24 are plan views.

Figure 3:
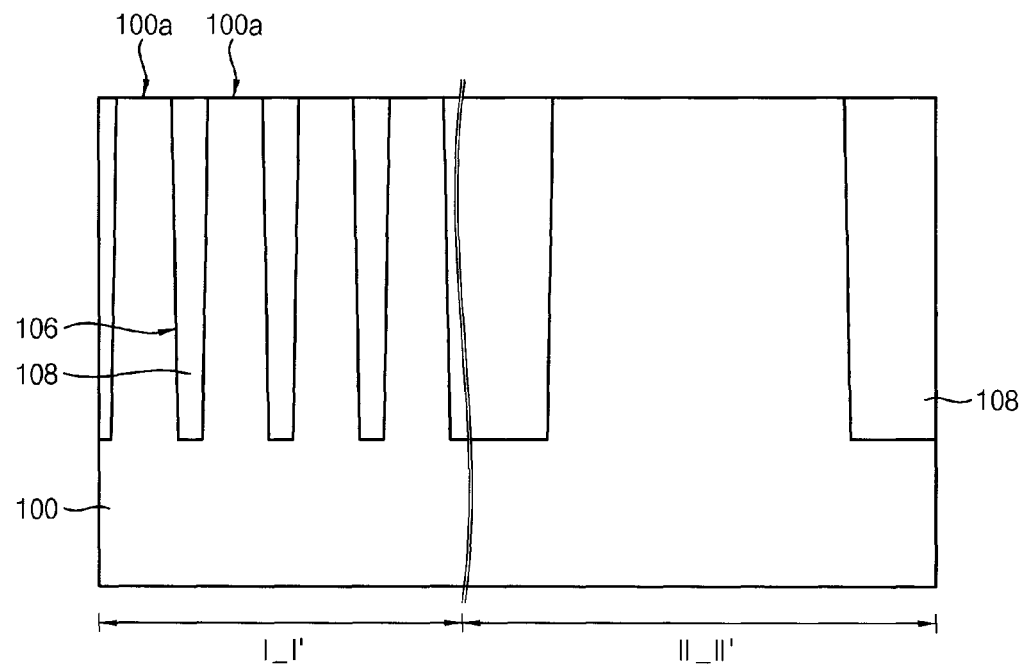
FIGS. 3 to 24 are cross-sectional views and plan views illustrating in an example method of manufacturing the semiconductor device of FIG. 1.
Figure 4:
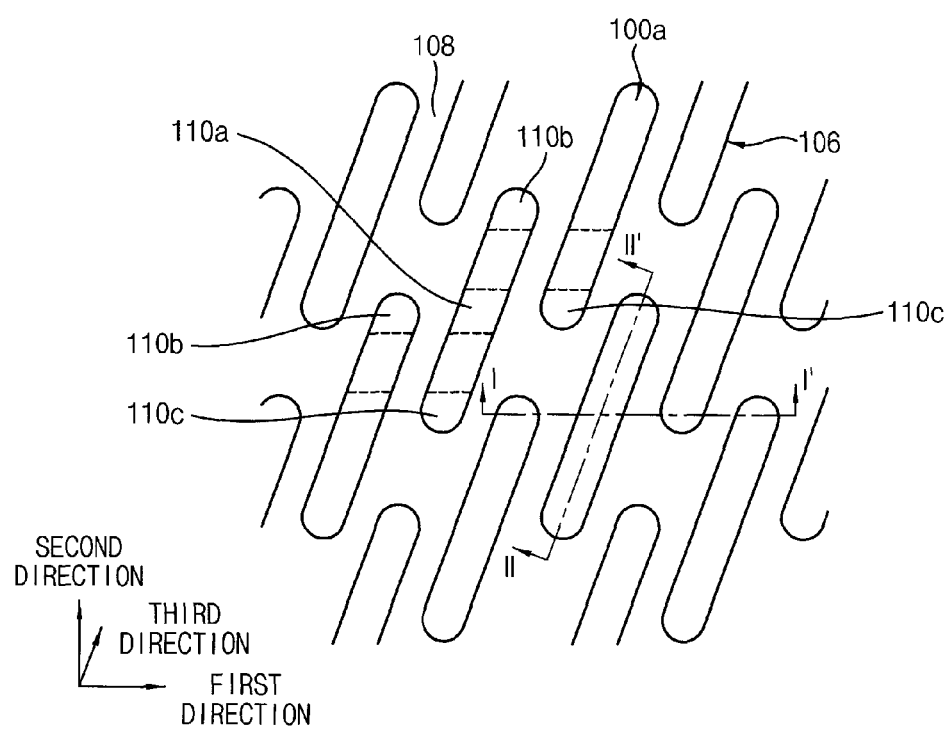

Referring to FIGS. 3 and 4, a hard mask (not shown) may be formed on a substrate 100. The hard mask may be formed to include, e.g., silicon nitride.

The substrate 100 may be anisotropically etched using the hard mask as an etching mask to form trenches 106. Portions of the substrate 100 between the trenches 106 may be referred to as active patterns 100a, which may serve as active regions.

Each of the active patterns 100a may extend in the third direction. The active patterns 100a may be formed in the third direction. A first contact region 110a of one of the active patterns 100a may be formed to face second and third contact regions 100b and 100c of neighboring active patterns 100a in the first direction.

An insulation layer may be formed to fill the trenches 106. The insulation layer may include, e.g., silicon oxide. The insulation layer may be planarized until a top surface of the active patterns 100a may be exposed to form a preliminary isolation pattern 108. During the planarization process, the hard mask may be almost removed.

Impurities may be doped into the substrate 100 to form impurity regions (not shown). The impurity regions may serve as a source region or a drain region of a buried transistor.

Figure 5:
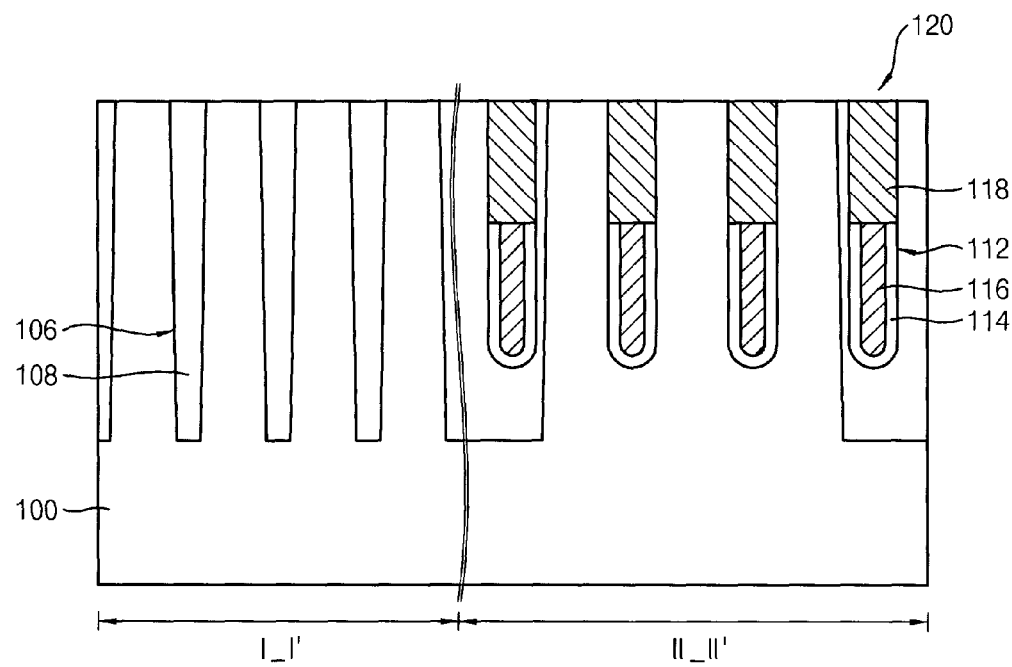
Figure 6:
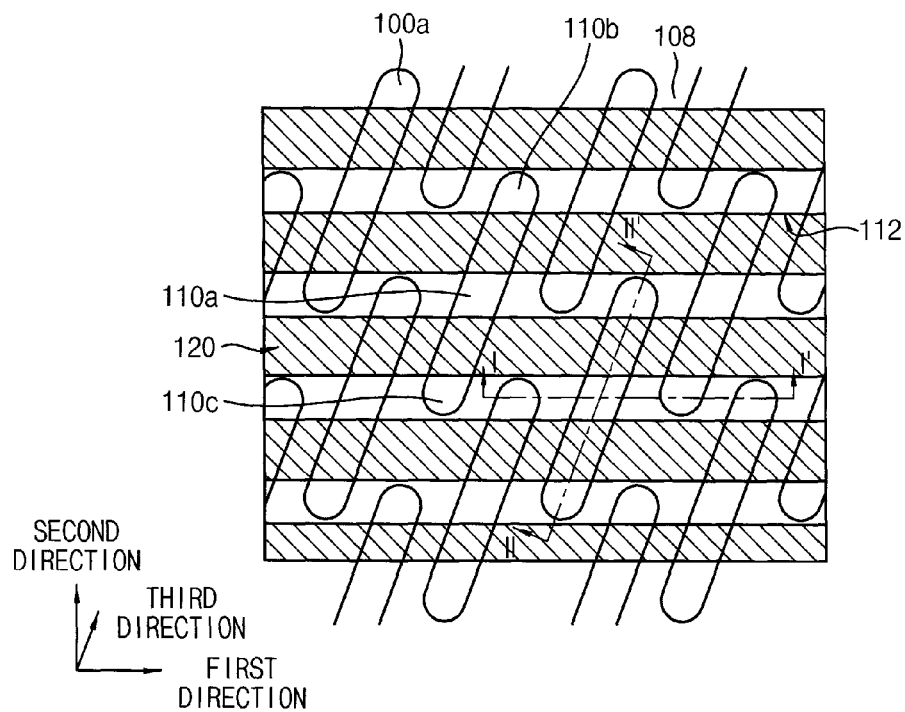

Referring to FIGS. 5 and 6, the active patterns 100a and the preliminary isolation pattern 108 may be partially etched to form gate trenches 112 extending in the first direction.

In example embodiments, two gate trenches 112 may be formed in parallel with each other on each of the active patterns 100a. The first, second and third contact regions 110a, 110b and 110c may be divided by the buried gate trenches 112.

A gate insulation layer 114 may be conformally formed on a sidewall and a bottom surface of each of the gate trenches 112. In example embodiments, the gate insulation layer 114 may be formed to include an oxide, e.g., silicon oxide by a thermal oxidation process or a chemical vapor deposition (CVD) process. A gate electrode layer may be formed on the gate insulation layer 114 to sufficiently fill the gate trenches 112. The gate electrode layer may be formed to include a barrier layer (not shown) and a metal layer (not shown). The barrier layer may include a metal, e.g., titanium, tantalum, etc., or a metal nitride, e.g., titanium nitride, tantalum nitride, etc. The metal layer may include, e.g., tungsten. The gate electrode layer may be planarized by a chemical mechanical polishing (CMP) process until top surfaces of the active patterns 100a may be exposed, and the gate electrode layer may be etched by an etch back process to form a gate electrode 116 filling a lower portion of each of the gate trenches 112.

A first mask layer may be formed on the gate electrode 116 to fill remaining portions of the gate trenches 112, and may be planarized by a CMP process and/or an etch back process until the top surfaces of the active patterns 110a may be exposed to form a first hard mask 118. The first hard mask 118 may be formed to include, e.g., silicon nitride.

Thus, a buried gate structure 120 including the gate insulation layer 114, the gate electrode 116 and the first hard mask 118 may be formed on the active patterns 100a and the preliminary isolation pattern 108 to extend in the first direction.

Figure 7:
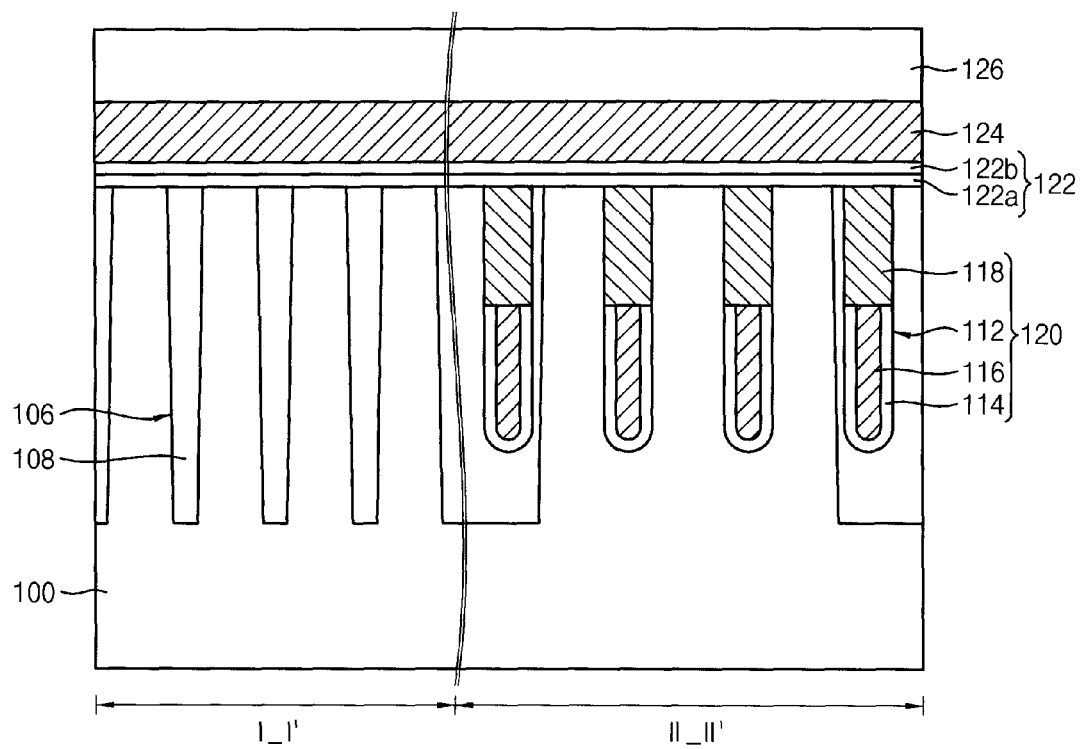

Referring to FIG. 7, a first insulation layer structure 122 may be formed on the substrate 100. The first insulation layer structure 122 may be formed to include a pad insulation layer 122a and an etch stop layer 122b sequentially stacked. The pad insulation layer 122a may be formed to include, e.g., silicon oxide. The etch stop layer 122b may be formed to include an insulation material having a high etching selectivity with respect to the pad insulation layer 122a. The etch stop layer 122a may be formed to include, e.g., silicon nitride.

A first conductive layer 124 may be formed on the etch stop layer 122b. The first conductive layer 124 may be formed to include a material that may be easily removed by an anisotropic etch process. In example embodiments, the first conductive layer 124 may be formed to include, e.g., polysilicon.

A sacrificial layer 126 may be formed on the first conductive layer 124. The sacrificial layer 126 may protect the first conductive layer 124 during etching processes subsequently performed. The sacrificial layer 126 may be formed include, e.g., silicon oxide.

Figure 8:
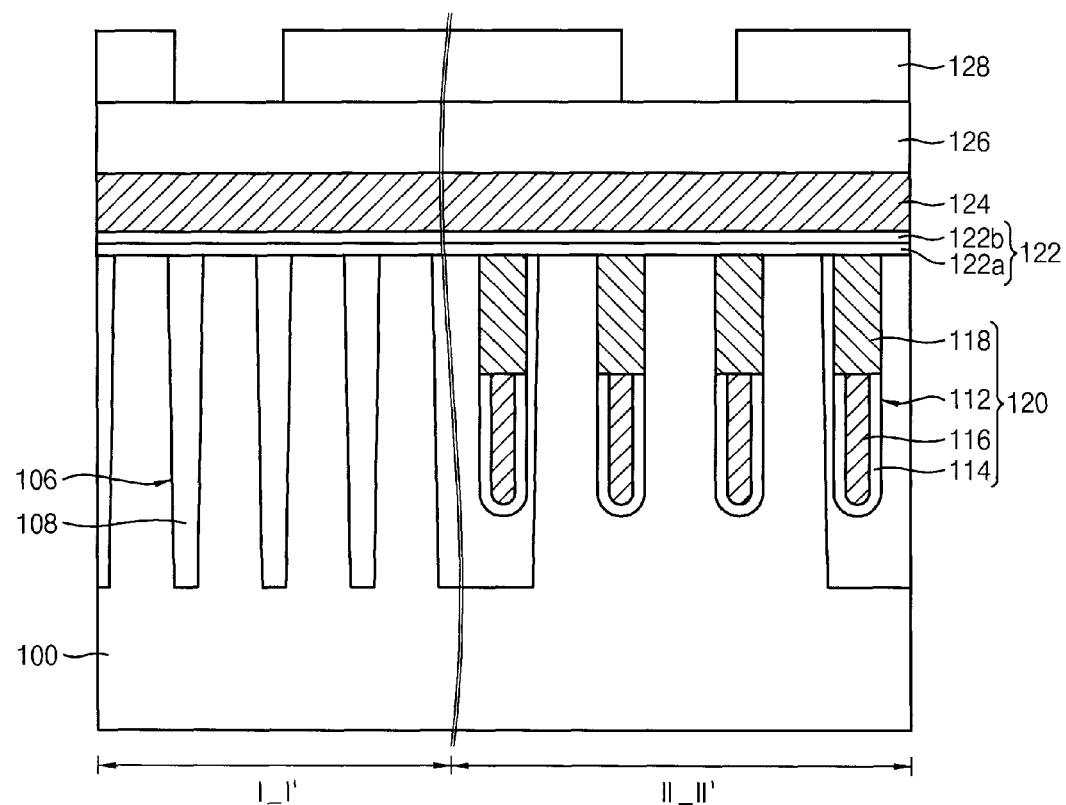
Figure 9:
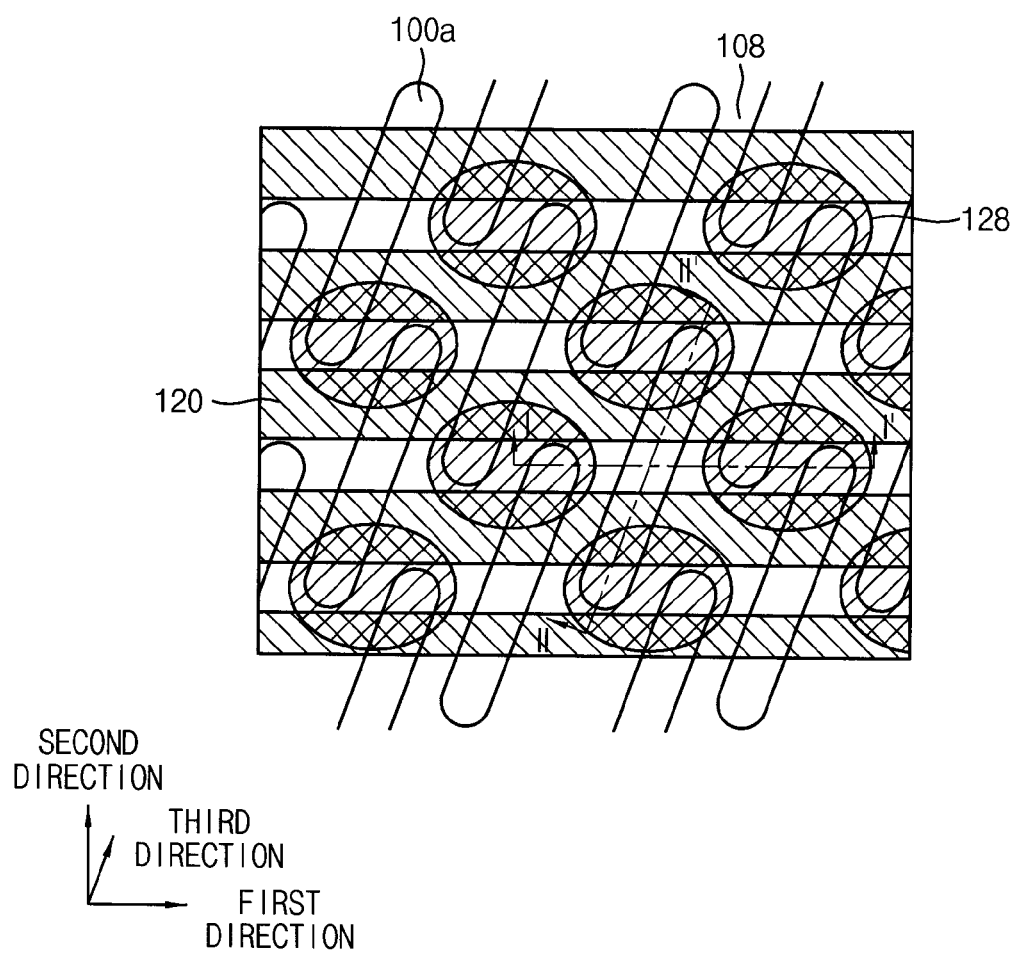

Referring to FIGS. 8 and 9, a photoresist film may be coated on the sacrificial layer 126, and may be patterned by a photo process to form a photoresist pattern 128. In example embodiments, a plurality of photoresist patterns 128 may be formed not to overlap at least corresponding first contact regions 110a.

In example embodiments, as shown in FIG. 9, the photoresist patterns 128 may be formed to have an island shape from each other, and may overlap the second and third contact regions 110b and 110c and a portion of the preliminary isolation pattern 108 adjacent to the second and third contact regions 110b and 110c. The first contact region 110a may not be overlapped by the photoresist patterns 128. The second and third contact regions 110b and 110c in each of the active patterns 100a may be overlapped by different photoresist patterns 128, respectively. Each of the photoresist patterns 128 may overlap the second contact region 110b of one of the active patterns 100a and the third contact region 110c of another one of the active patterns 100a adjacent thereto in the first direction.

Each of the photoresist patterns 128 may overlap the second and third contact regions 110b and 110c only, and thus an area not overlapped by the photoresist patterns 128 may have an increased size.

Figure 10:
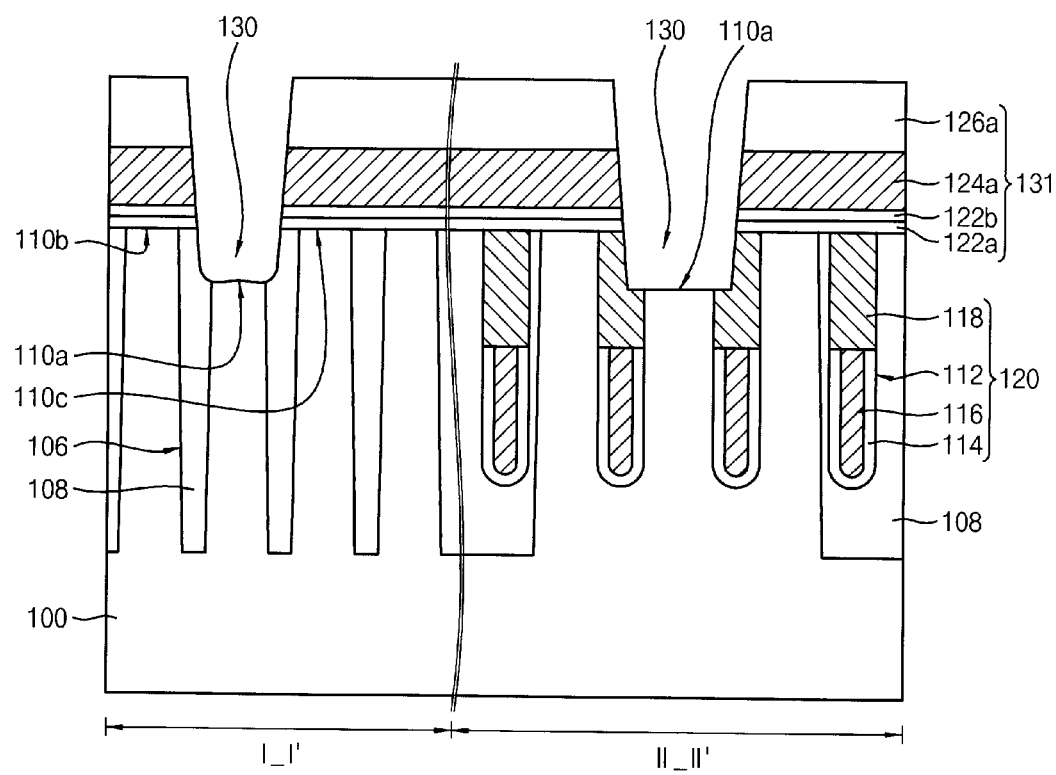
Figure 11:
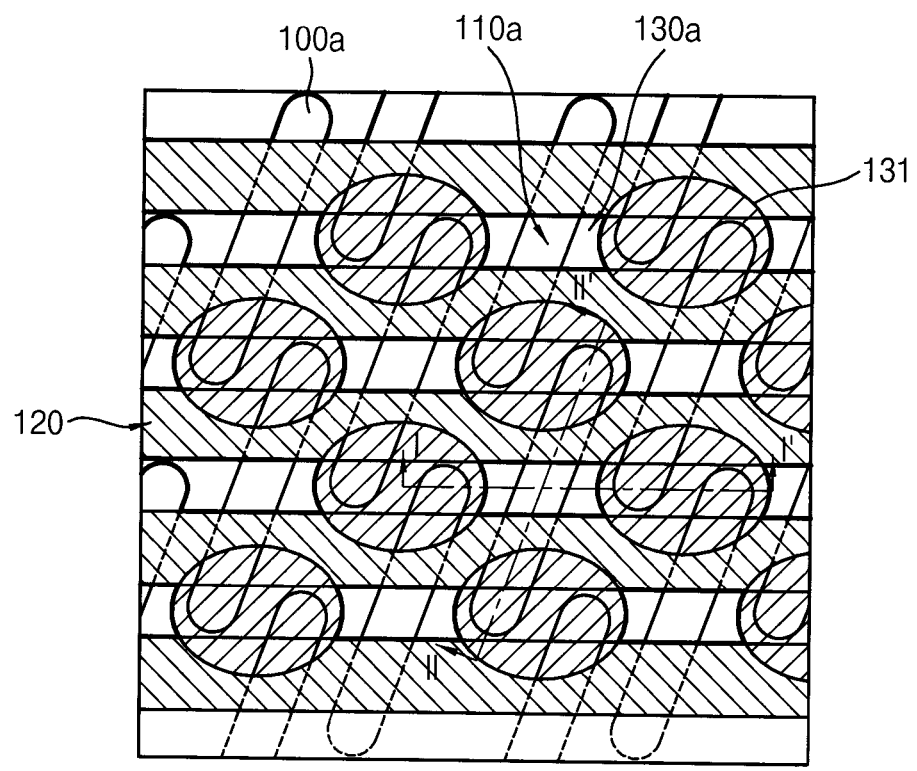
Figure 11:
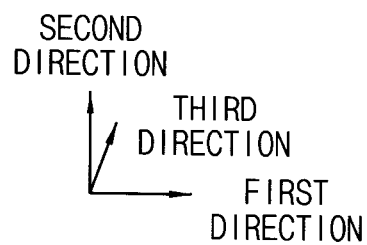

Referring to FIGS. 10 and 11, the sacrificial layer 126, the first conductive layer 124, the etch stop layer 122b, the pad insulation layer 122a and the active patterns 100a may be etched using the photoresist patterns 126 as an etching mask to form a first preliminary opening 130. A bottom surface the first preliminary opening 130 may have a first width in the first direction, and may expose the first contact region 110a and the preliminary isolation pattern 108. A lower sidewall of the first preliminary opening 130 may expose the preliminary isolation pattern 108. In the etching process for forming the first preliminary opening 130, the first contact region 110a of each of the active patterns 100a may be partially etched. Thus, a top surface of the first contact region 110a may be lower than those of the second and third contact regions 110b and 110c. A top surface of each of the active patterns 100a may have different heights in accordance with positions thereof, so that a short failure between a contact pattern 138a (refer to FIG. 21) and a storage node contact 152 (refer to FIGS. 23 and 24) subsequently formed may decrease.

By the etching process, a first structure 131 including the pad insulation layer 122a, the etch stop layer 122b, a first preliminary conductive layer pattern 124a and a sacrificial layer pattern 126a sequentially stacked may be formed. A plurality of first structures 131 each of which may have a pillar shape may be formed to cover the second and third contact regions 110b and 110c. In example embodiments, each of the first structures 131 may have, e.g., a circular solid cylindrical shape or an elliptical solid cylindrical shape. The first preliminary opening 130 may be formed between the first structures 131.

In example embodiments, a sidewall of each of the first structures 131 may have a slope, so that a lower width of the first structure 131 may be greater than an upper width of the first structure 131. Thus, a lower width of the first preliminary opening 130 between the first structures 131 may be smaller than an upper width of the first preliminary opening 130.

Figure 12:
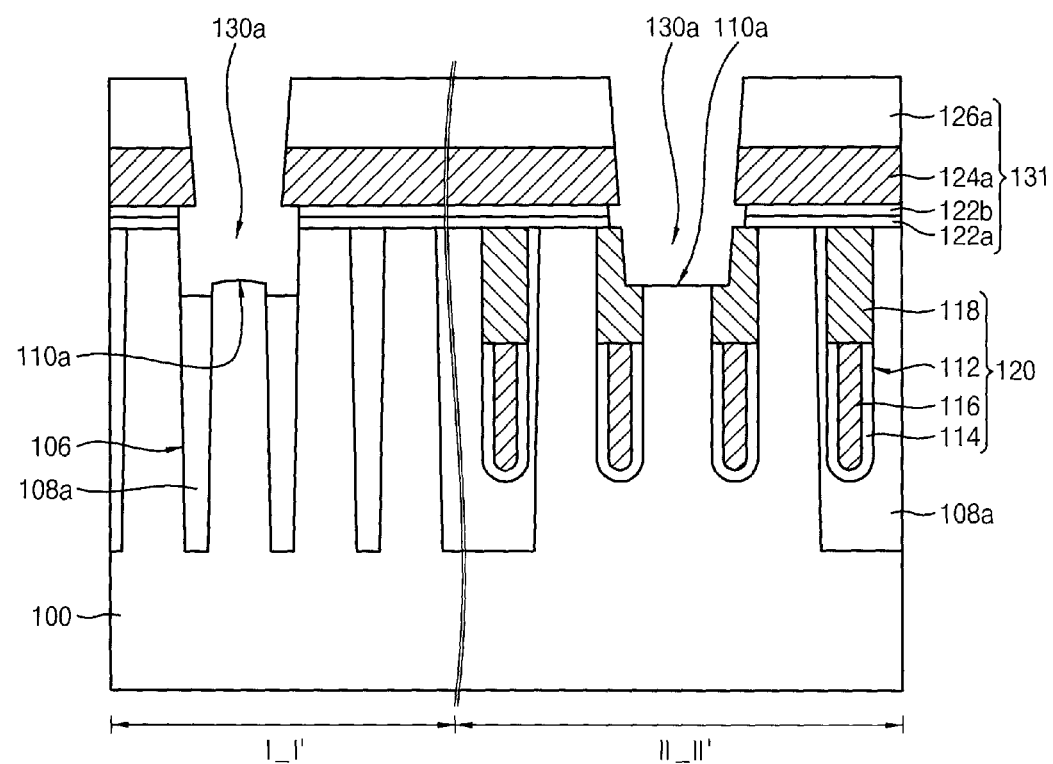
Figure 13:
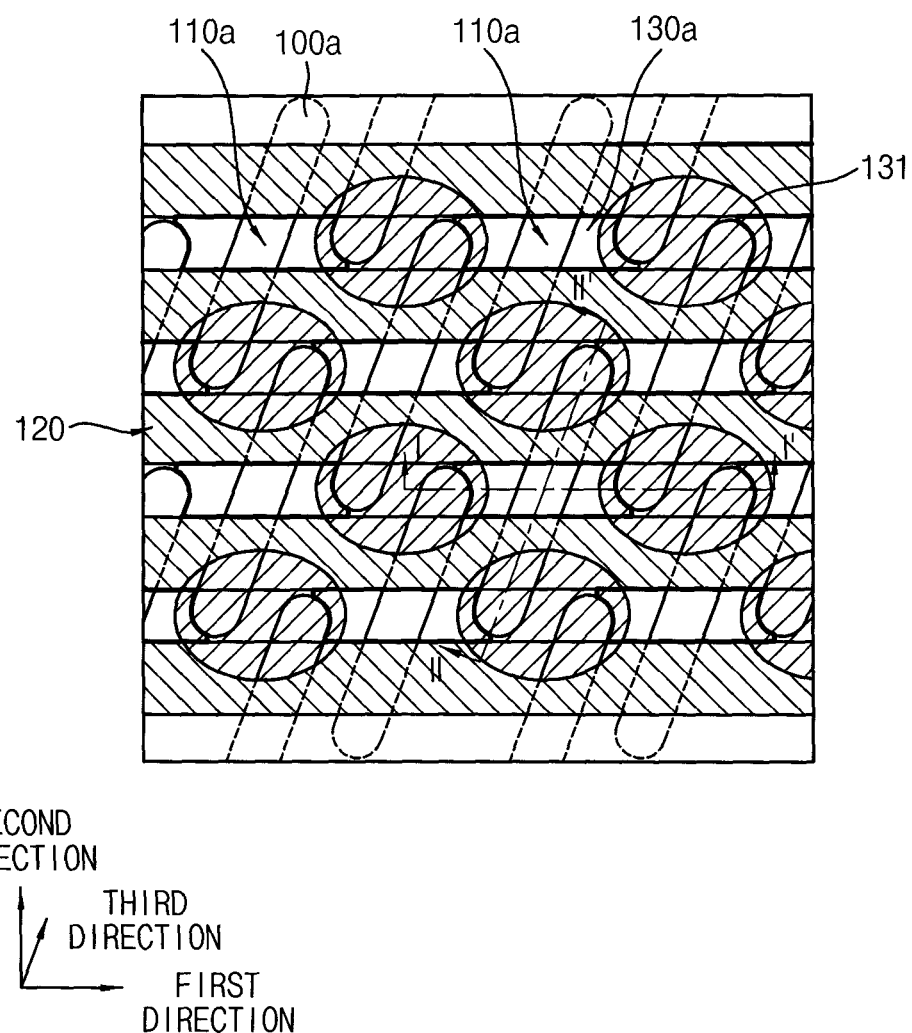

Referring to FIGS. 12 and 13, the preliminary isolation pattern 108 on the sidewall of the preliminary opening 130 may be partially etched to form a second preliminary opening 130a. Thus, a lower portion of the second preliminary opening 130a may have an enlarged width in the first direction.

During the etching of the preliminary isolation pattern 108, a portion of the first insulation layer structure 122 including, e.g., silicon oxide, may be also etched. When the first insulation layer structure 122 includes a silicon nitride layer, the first insulation layer structure 122 may be partially etched. However, the first preliminary conductive layer pattern 124a may not be etched during the etching of the preliminary isolation pattern 108. Thus, the first preliminary conductive layer pattern 124a may protrude from the sidewall of the first insulation layer structure 122.

In some example embodiments, the first preliminary conductive layer pattern 124a may be formed not to protrude from the sidewall of the first insulation layer structure 122. Particularly, the slope of the sidewall of the first preliminary opening 130 may be controlled so that an upper width of the first preliminary opening 130 may be greater than a lower width thereof. Thus, the first preliminary conductive pattern 124a may have a relatively small width when the first preliminary opening 130 is formed, and may not protrude from the sidewall of the first insulation layer structure 122 even after partially etching the first preliminary opening 130 to form the second preliminary opening 130a. In example embodiments, the preliminary isolation layer 108 may be partially etched to expose sidewalls of the active patterns 100a and the buried gate structures 120 by the second preliminary opening 130a. Thus, the second preliminary opening 130a may have an enlarged area in the first direction, and expose the first contact region 110a.

The preliminary isolation pattern 108 may be partially etched to form an isolation pattern 108a. A bottom surface of the second preliminary opening 130a may expose the first contact region 110a and the isolation pattern 108a. A top surface of the isolation pattern 108a may be substantially coplanar with that of the first contact region 110a, or lower than that of the first contact region 110a. Preferably, the top surface of the isolation pattern 108a may be substantially coplanar with that of the first contact region 110a. The etching process may include an isotropic etching process, e.g., a wet etching process, a dry isotropic etching process, etc.

Figure 14:
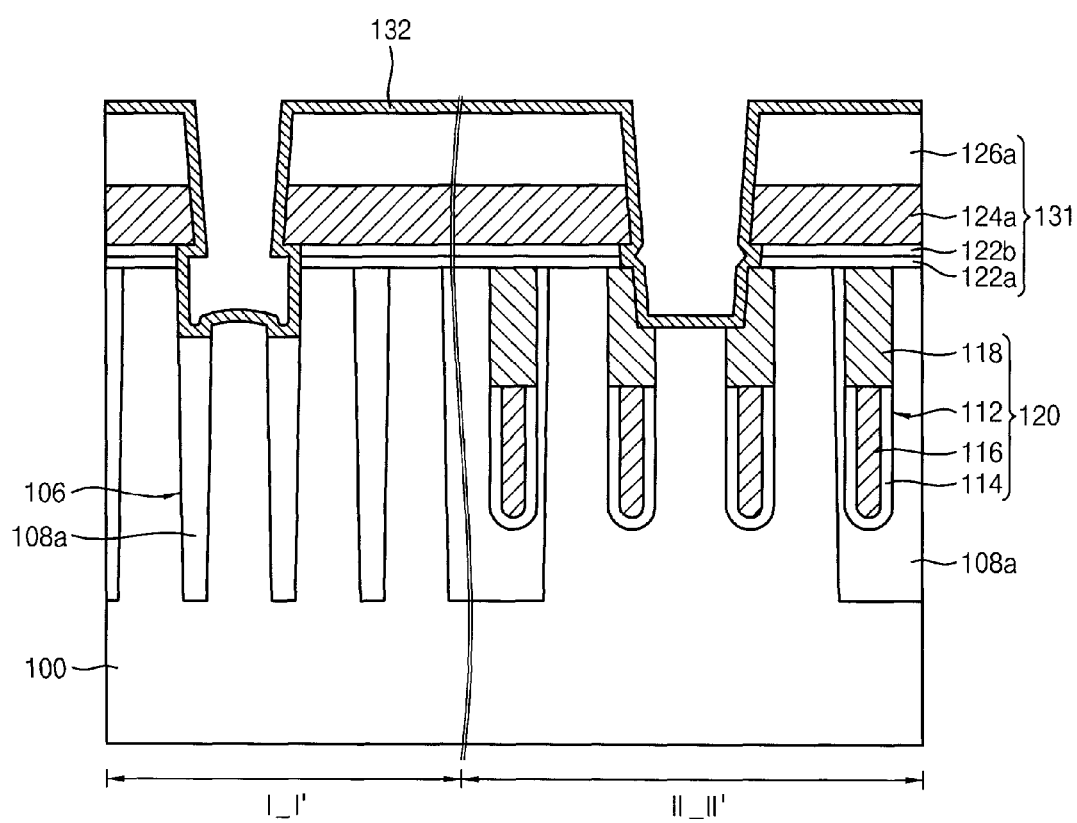

Referring to FIG. 14, an insulation liner 132 may be conformally formed on an inner surface of the second preliminary opening 130a and a surface of the first structure 131 to fill a gap between each of the active patterns 100a and the buried gate structure 120. Thus, the insulation liner 132 may electrically insulate each of the active patterns 100a from the buried gate structure 120.

Figure 15:
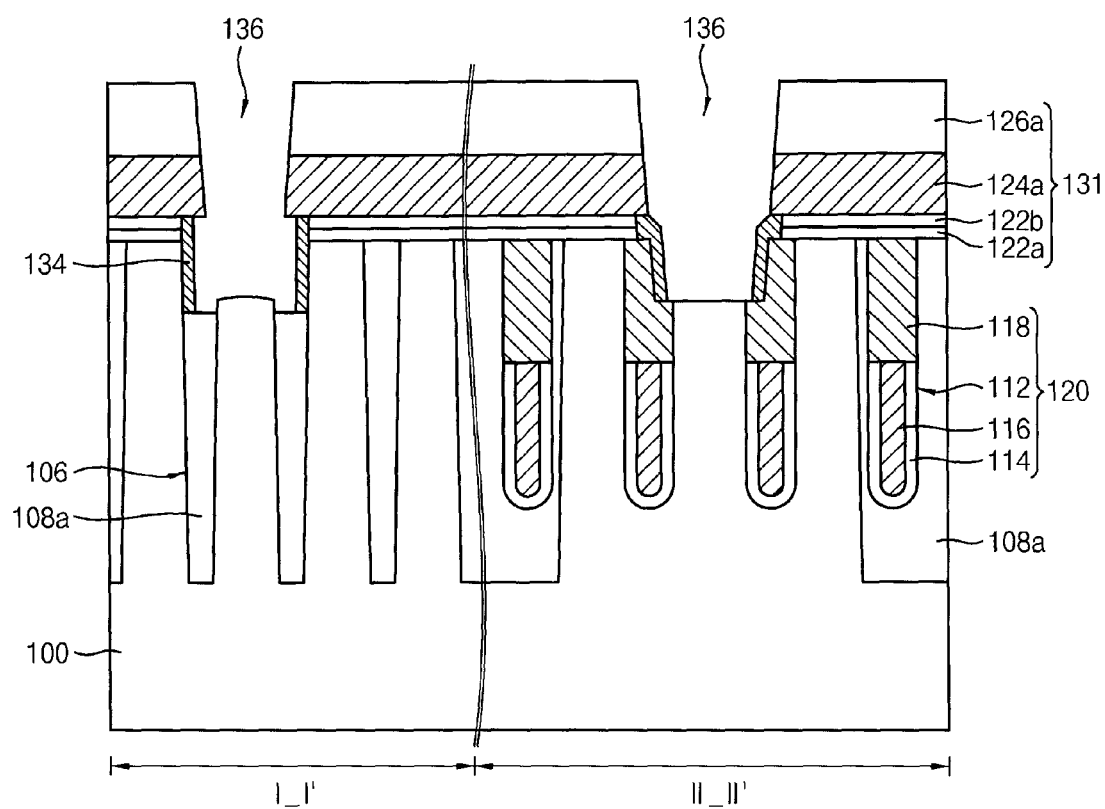
Figure 16:
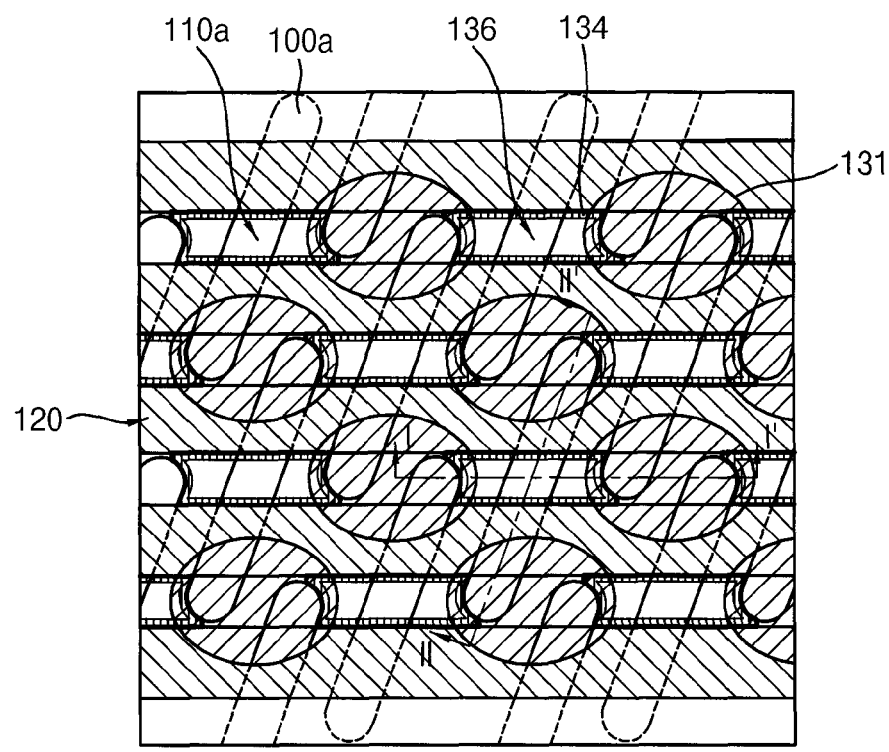
Figure 16:
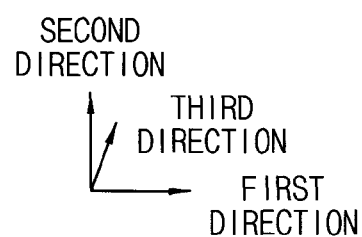

Referring to FIGS. 15 and 16, the insulation liner 132 may be anisotropically etched to form an insulation pattern 134 on the sidewall of the second preliminary opening 130a.

The insulation pattern 134 may be formed to fill the gap between each of the active patterns 100a and the buried gate structure 120. In plan view, the insulation pattern 134 may be formed to have a closed line shape. The second preliminary opening 130a may be transformed into a plurality of first openings 136 having an island shape from each other at an inside of the insulation pattern 134. The insulation pattern 134 may be formed to include, e.g., silicon oxide, silicon nitride, or silicon oxynitride.

The insulation pattern 134 may be formed on the active patterns 100a and the buried gate structure 120 exposed by the sidewall of the second preliminary opening 130a. The insulation pattern 134 may be formed to cover the first insulation layer structure 122 of the first structure 131 in the second preliminary opening 130a. However, the insulation liner 132 on the first preliminary conductive layer pattern 124a and the sacrificial layer pattern 126a may be removed by the etching process, so that the insulation pattern 134 may not cover sidewalls of the first preliminary conductive layer pattern 124a and the sacrificial layer pattern 126a. Additionally, the insulation liner 132 on the bottom of the second preliminary opening 130a may be removed, so that the bottom surface of the first opening 136 may expose the first contact region 110a and the isolation pattern 108a.

Figure 17:
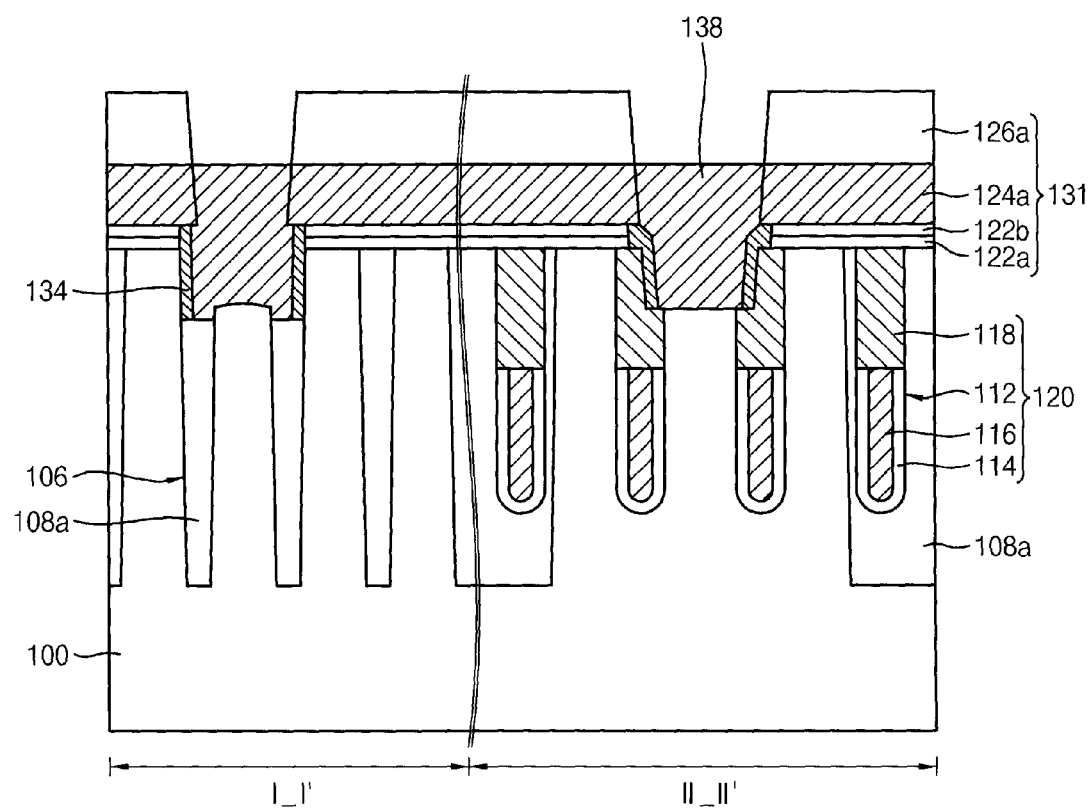
Figure 18:
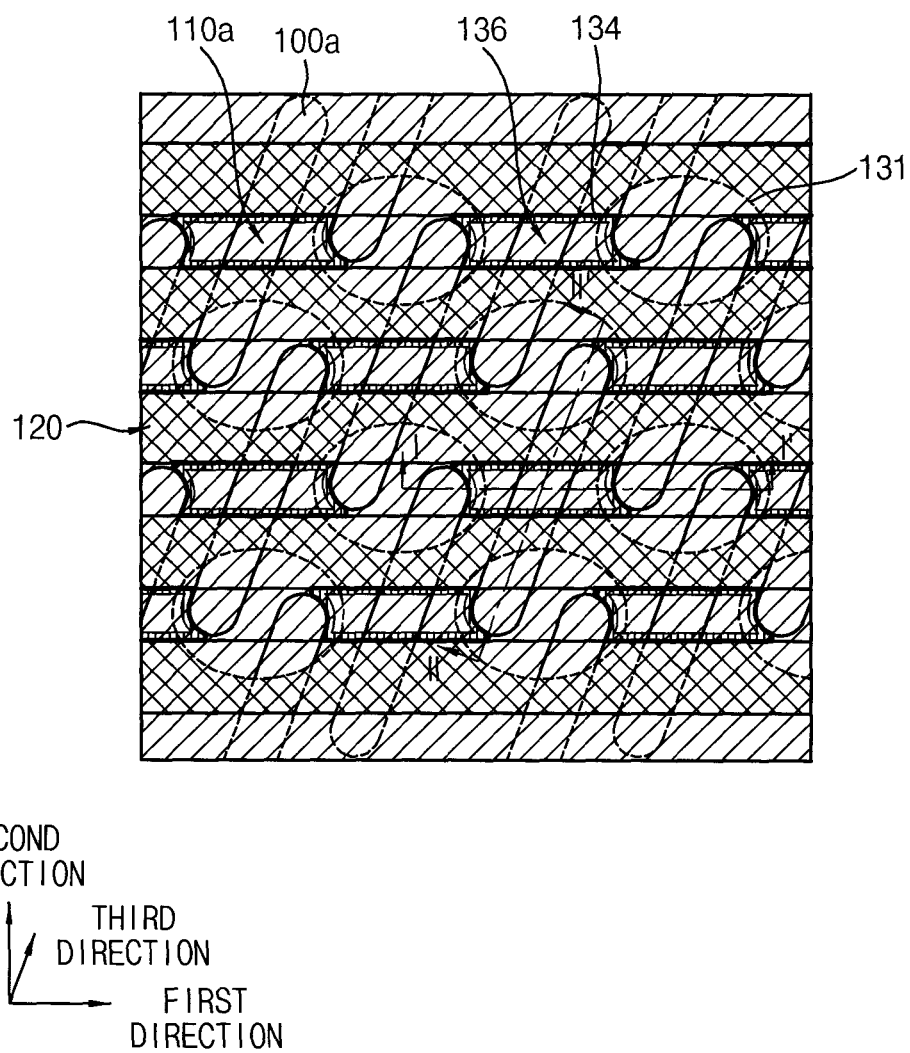

Referring to FIGS. 17 and 18, a second conductive layer may be formed on the sacrificial layer pattern 126a to fill the first opening 136. The second conductive layer may serve as a material for forming a bit line contact.

In example embodiments, the second conductive layer may be formed to include a material substantially the same as that of the first preliminary conductive layer pattern 124a, e.g., polysilicon. Alternatively, the second conductive layer may be formed to include a material different from that of the first preliminary conductive layer pattern 124a, e.g., a metal.

The second conductive layer may be planarized to form a second preliminary conductive layer pattern 138 in the first opening 136. The planarization process may include a CMP process and/or an etch back process, and preferably, include the etch back process. A top surface of the second preliminary conductive layer pattern 138 may be substantially coplanar with a top surface of the first preliminary conductive layer pattern 124a. The first and second preliminary conductive layer patterns 124a and 138 may be electrically connected with each other in a horizontal direction, and may be formed to cover all of the substrate 100.

Figure 19:
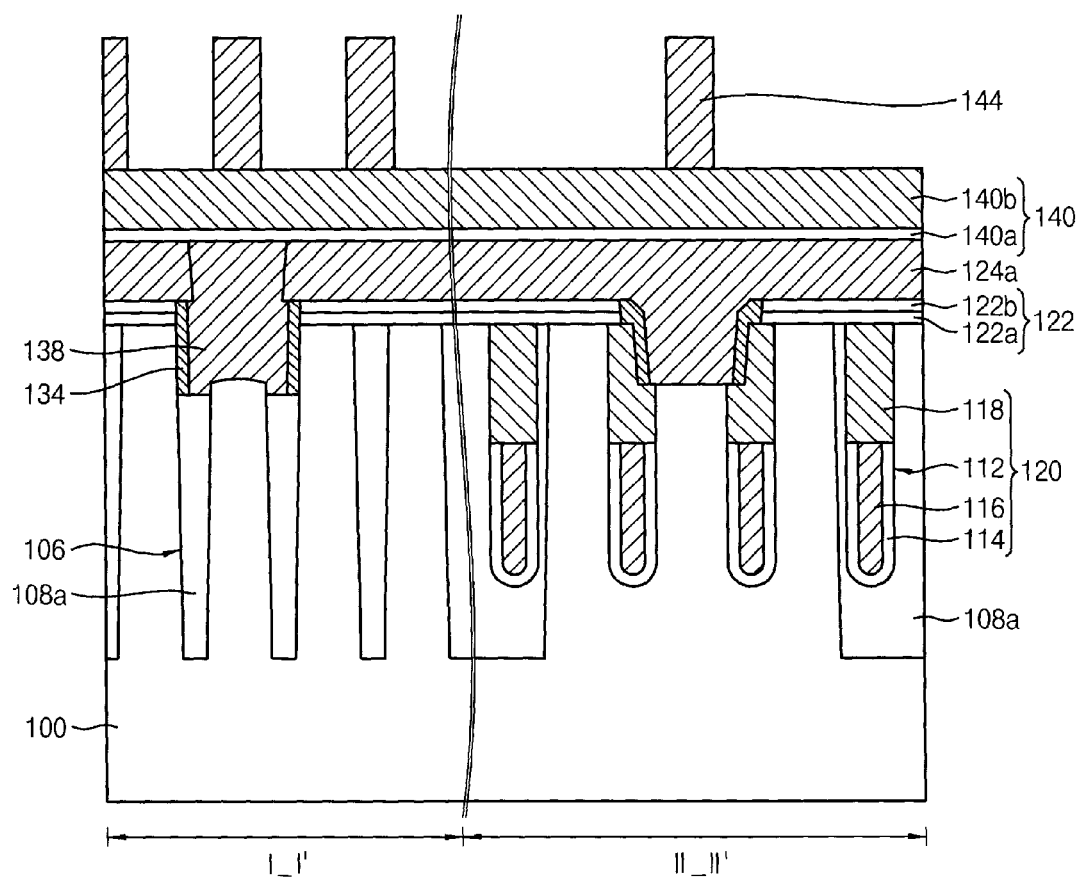
Figure 20:
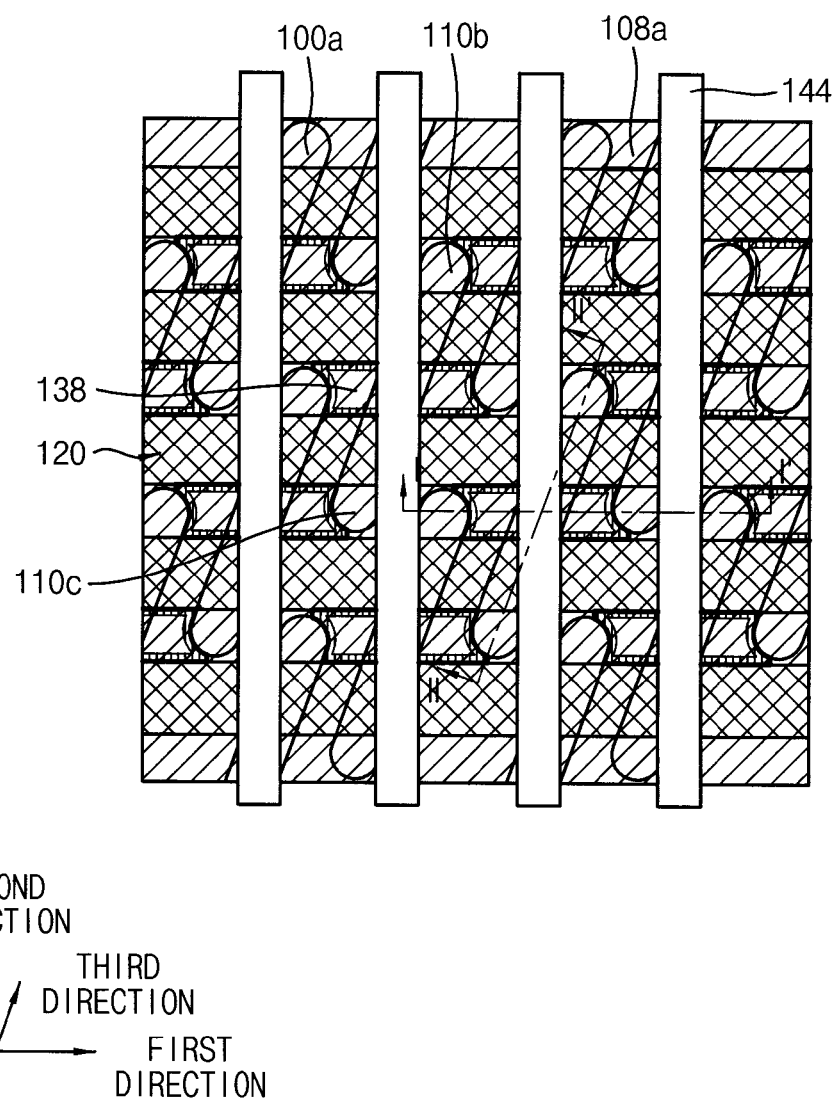

Referring to FIGS. 19 and 20, the sacrificial layer pattern 126a may be removed. A third conductive layer 140 may be formed on the first and second preliminary conductive layer patterns 124a and 138. The third conductive layer 140 may be formed to include a metal having a resistance lower than resistances of the first and second preliminary contact patterns 124a and 138. The third conductive layer 140 may be formed to include a barrier layer 140a and a metal layer 140b sequentially stacked.

The barrier layer 140a may be formed to include a metal, e.g., titanium, tantalum, etc., or a metal nitride, e.g., titanium nitride, tantalum nitride, etc. The metal layer 140b may be formed to include, e.g., tungsten, etc.

A second hard mask layer may be form on the third conductive layer 140 to include silicon nitride. The second hard mask layer may be patterned to form a second hard mask 144 for forming a bit line structure 146 (refer to FIGS. 21 and 22). The second hard mask 144 may be formed to overlap the first contact region 110a and to extend in the second direction.

Figure 21:
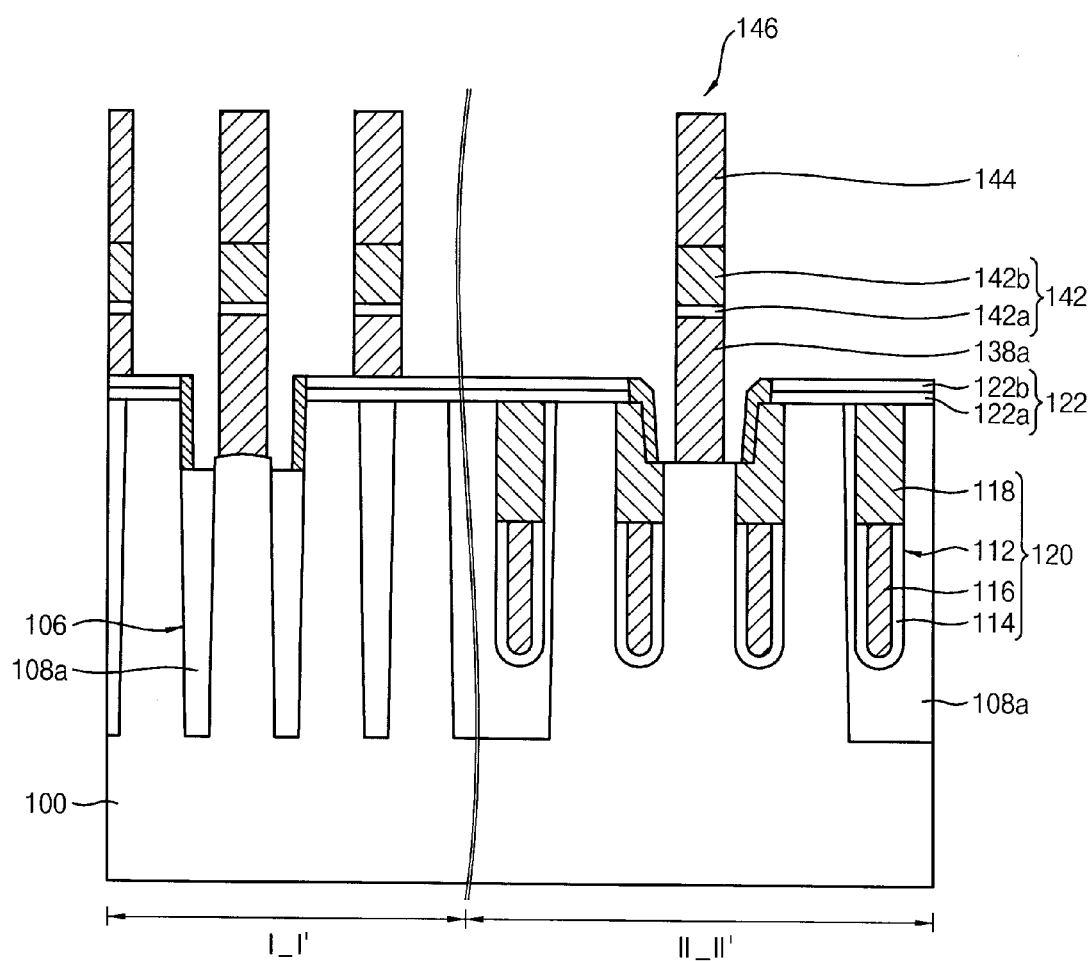
Figure 22:
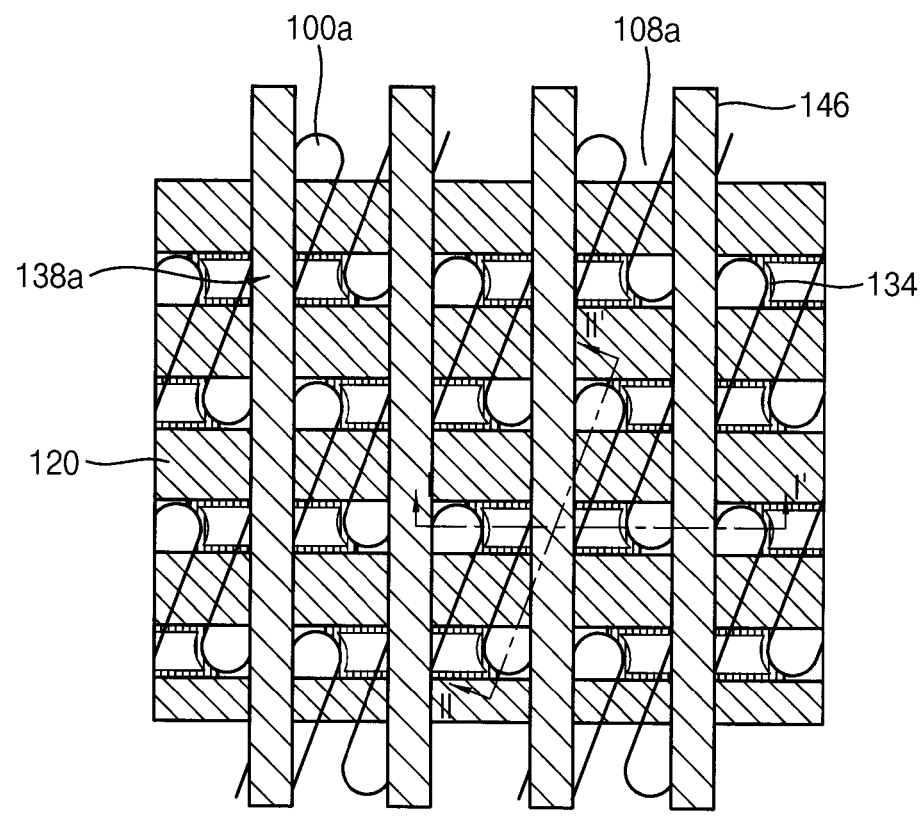
Figure 22:
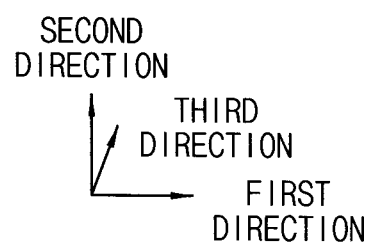

Referring to FIGS. 21 and 22, the third conductive layer 140 and the second and first preliminary conductive layer patterns 138 and 124a may be anisotropically etched using the second hard mask 144 as an etching mask to form the bit line structure 146. The bit line structure 146 may include a contact pattern 138a, a bit line 142 and the second hard mask 144 sequentially stacked.

The bit line structure 146 may be formed to directly contact the first contact region 110a and extend in the second direction. A width of the bit line structure 146 in the first direction may be smaller than a width of the first opening 136 in the first direction exposing the first contact region 110a. Thus, the bit line structure 146 may be formed at an inside of the first opening 136, and sidewalls of the bit line structure 146 and the insulation pattern 132 may be spaced apart from each other.

As described above, the first opening may 136 have an enlarged size in the first direction, so that a width of the first preliminary conductive layer pattern 138 in the first opening 136 may have an increased size. Thus, in the etching process of the first preliminary conductive layer pattern 138 in the first opening 136, etching gases may easily flow into the first opening 136. Accordingly, the second preliminary conductive layer pattern 138a in the first opening 136 may be easily etched, and the bit line structure 146 may be formed to have a minute critical dimension.

Figure 23:
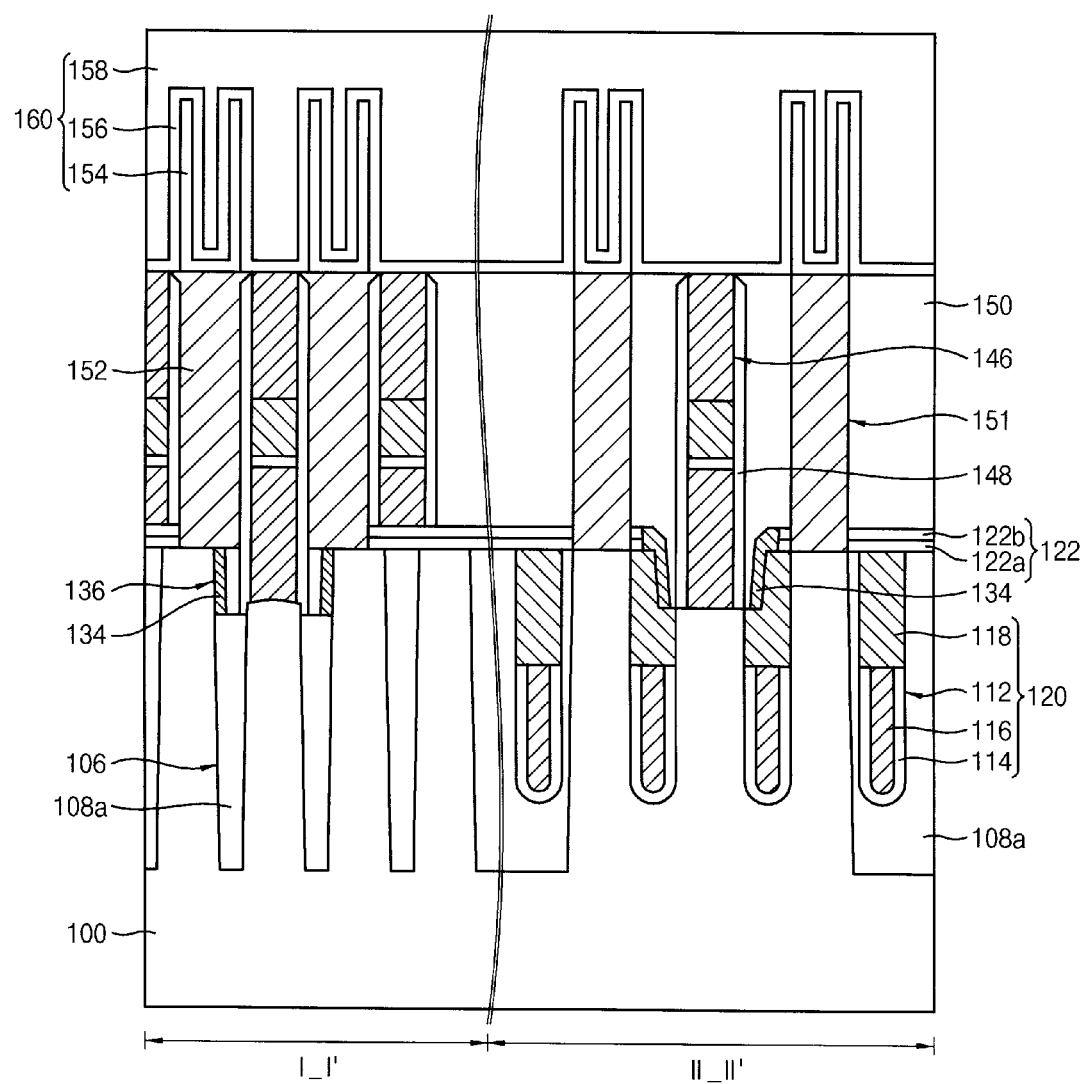
Figure 24:
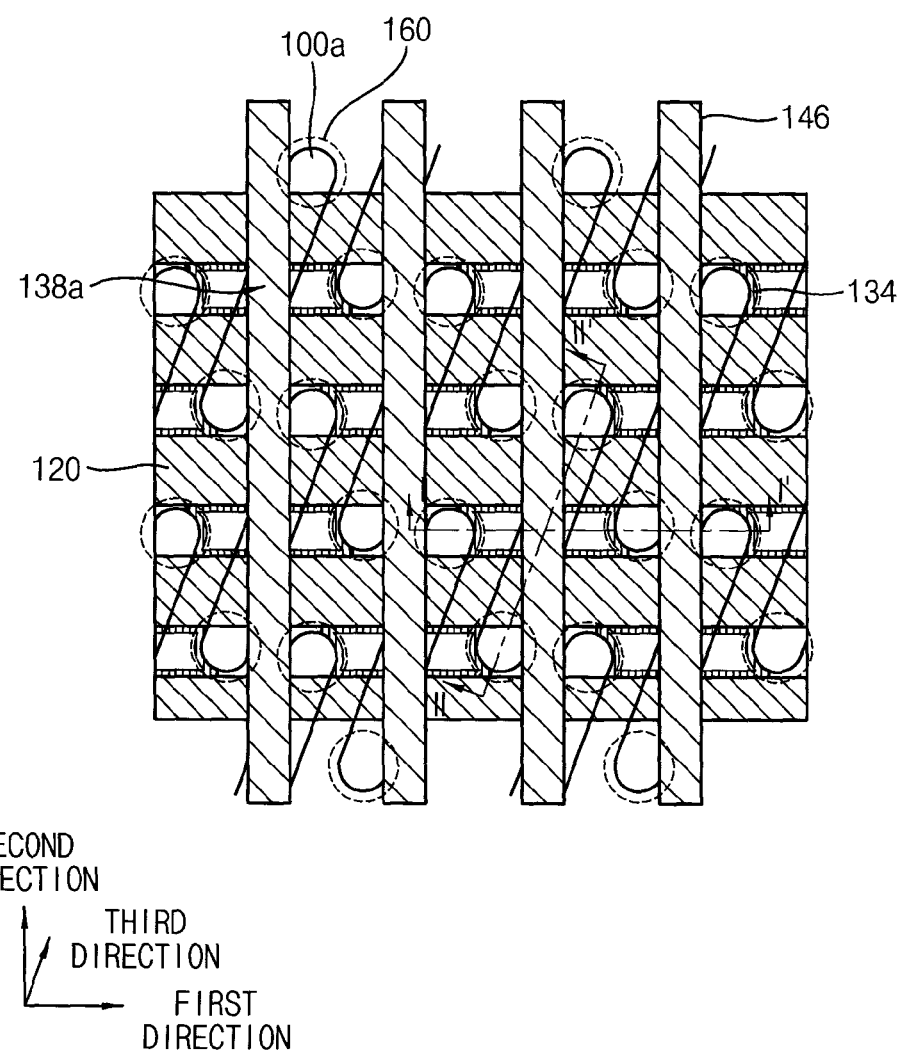

Referring to FIGS. 23 and 24, spacers 148 may be formed on sidewalls of the bit line structure 146. In example embodiments, the spacers 148 may be formed to include silicon nitride. Alternatively, the spacers 148 may be air spacers.

An insulating interlayer 150 may be formed to cover the bit line structure 146. In example embodiments, the insulating interlayer 150 may be planarized until a top surface of the bit line structure 146 may be exposed. An etching mask (not shown) not overlapping the second and third contact regions 110b and 110c may be formed on the insulating interlayer 150.

The insulating interlayer 150, the etch stop layer 122b and the pad insulation layer 122a may be etched using the etching mask to form storage node contact holes 151 exposing the second and third contact regions 110a and 110b, respectively.

A conductive layer may be formed to fill the storage node contact holes 151, and planarized by a CMP process to form the storage node contacts 152. The conductive layer may be formed to include, e.g., polysilicon or a metal. A capacitor 160 including a lower electrode 154, a dielectric layer 156 and an upper electrode 158 may be formed on each of the storage node contacts 152. The lower electrode 154 of the capacitor 160 may be formed to have, e.g., a cylindrical shape or a pillar shape.

As described above, the DRAM device in accordance with example embodiments may be manufactured.

FIGS. 25 to 28 are plan views illustrating stages of a method of manufacturing the semiconductor device of FIG. 1.

The method of manufacturing the semiconductor may include processes substantially the same as or similar to those illustrated with reference to FIGS. 3 to 24, except for a shape of the photoresist pattern on the sacrificial layer.

First, the structure of FIG. 7 may be formed by performing processes substantially the same as or similar to those illustrated with reference to FIGS. 3 to 7.

Cross-sectional views cut along lines I-I' and II-II' of FIGS. 25 to 28 may be substantially the same as FIGS. 8, 10, 12, 14, respectively.

Figure 25:
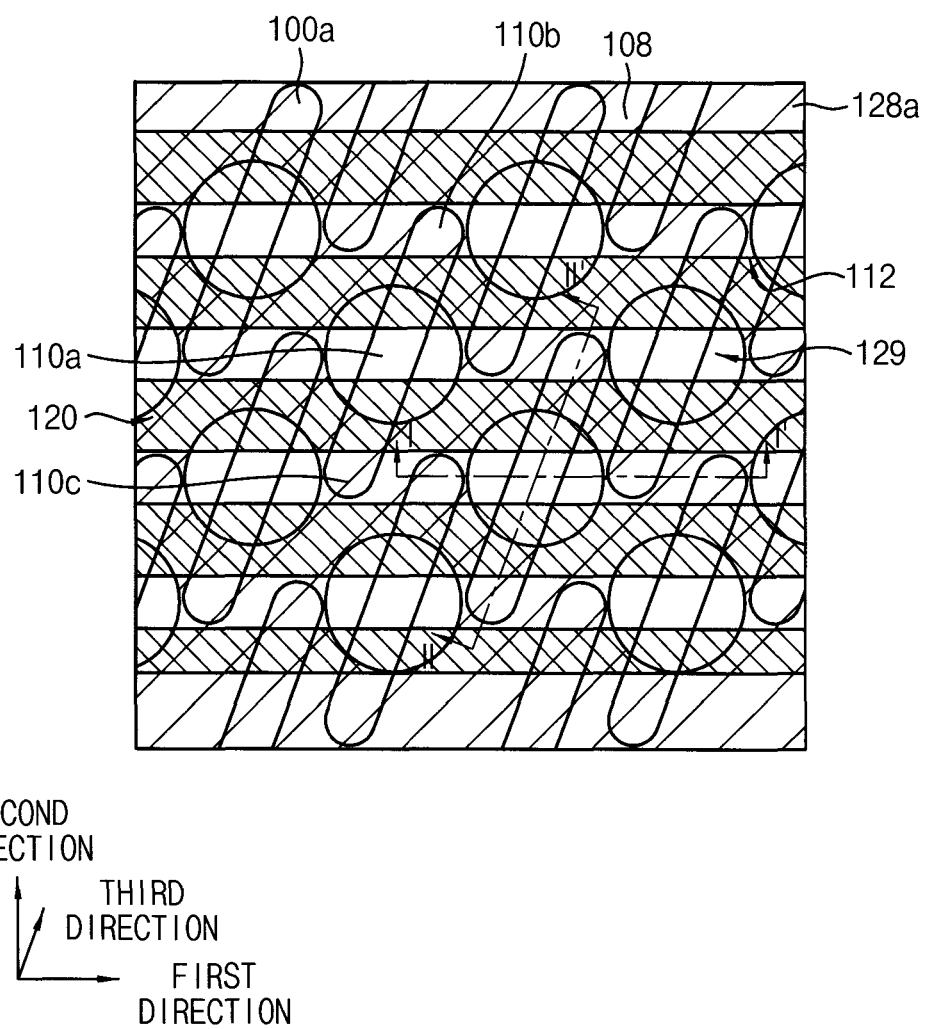
FIGS. 25 to 28 are cross-sectional views and plan views illustrating in an example method of manufacturing the semiconductor device of FIG. 1.

Referring to FIG. 25, a photoresist film may be coated on the sacrificial layer 126, and may be patterned by a photo process to form a photoresist pattern 128a. In example embodiments, the photoresist pattern 128a may be formed to include a hole 129 exposing the first contact region 110a, and to cover the sacrificial layer 126. Thus, the first contact region 110a may not be overlapped by the photoresist pattern 128a.

Figure 26:
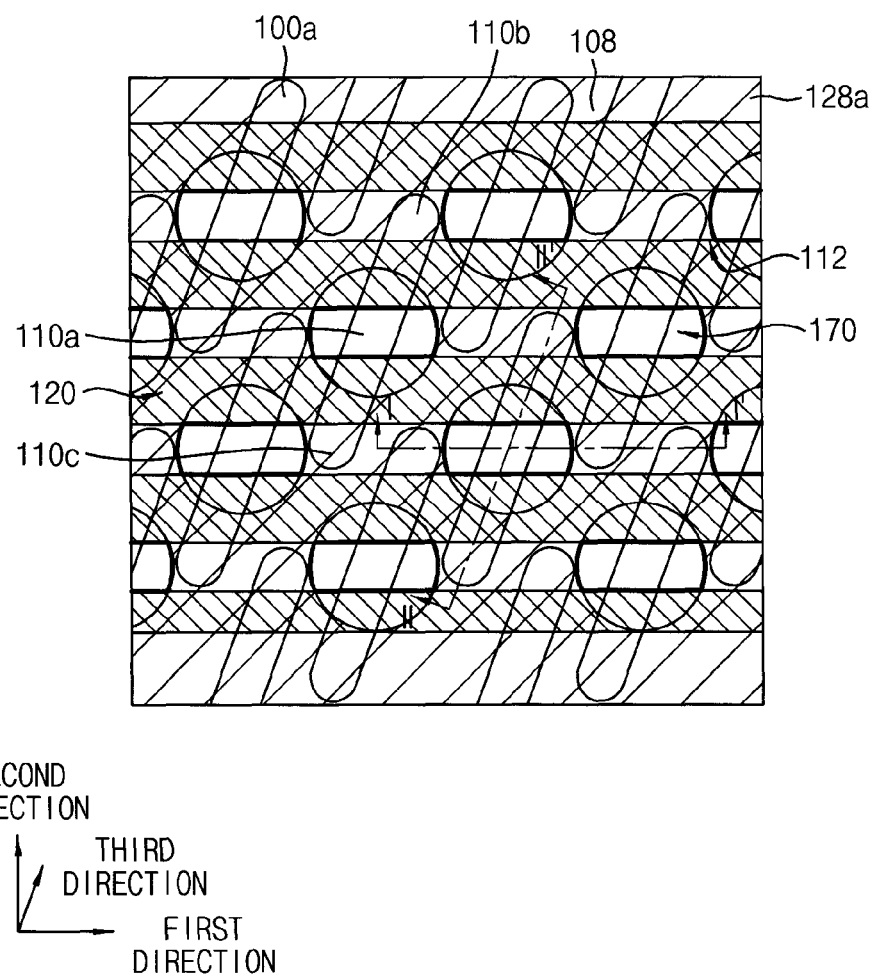

Referring to FIG. 26, the sacrificial layer 126, the first conductive layer 124, the first insulation layer structure 122 and the active patterns 100a may be etched using the photoresist pattern 128a as an etching mask to form a first preliminary opening 170.

The first preliminary opening 170 may be formed to expose the first contact region 110a.

Figure 27:
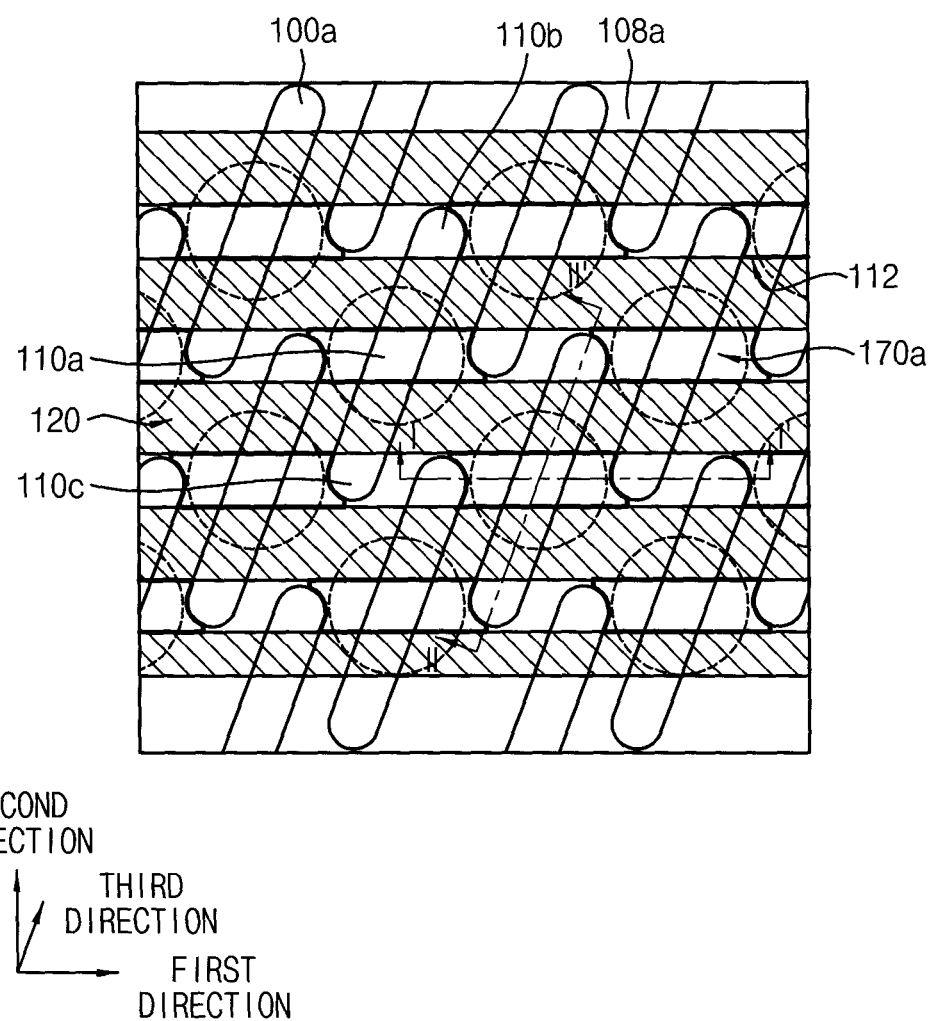

Referring to FIG. 27, the preliminary isolation pattern 108 on the sidewall of the first preliminary opening 130 may be partially etched to form a second preliminary opening 170a. Thus, the active patterns 100a and the buried gate structure 120 may be exposed by a sidewall of the second preliminary opening 170a. The second preliminary opening 170a may have an enlarged width in the first direction. The photoresist pattern 128a may be removed.

Figure 28:
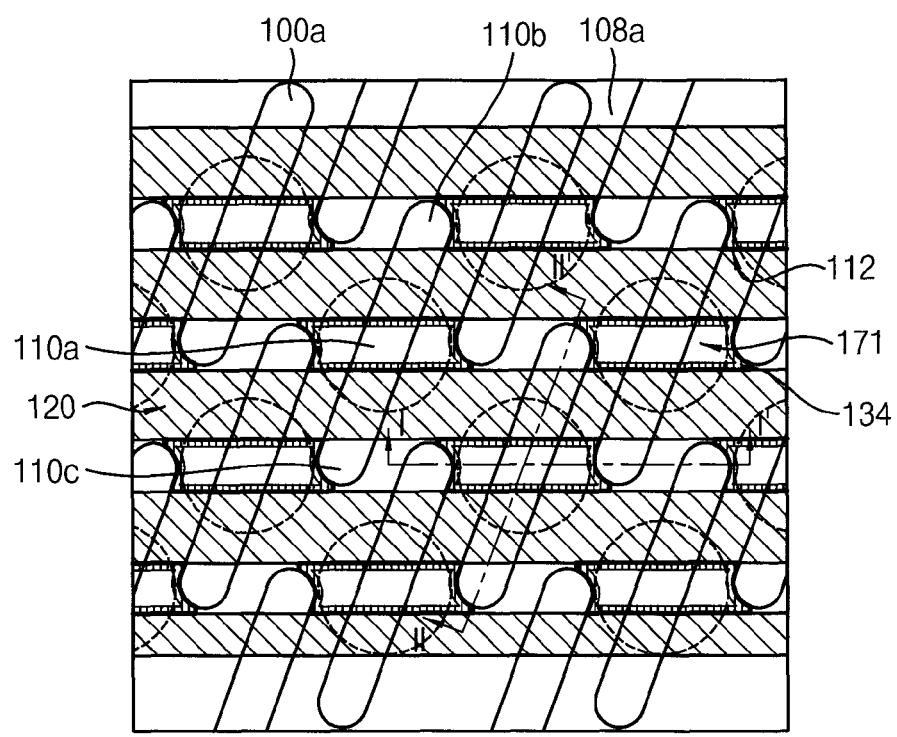
Figure 28:
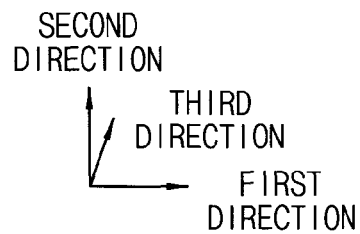

Referring to FIG. 28, an insulation liner may be conformally formed on an inner wall of the second preliminary opening 170a and a surface of the sacrificial layer 126. The insulation liner may be anisotropically etched to form an insulation pattern 134 on the sidewall of the second preliminary opening 170a. In plan view, the insulation pattern 134 may be formed to have a closed line shape. Thus, the second preliminary opening 130a may be transformed into a first opening 171 having an island shape.

Then, processes substantially the same as or similar to those illustrated with reference to FIGS. 17 to 24 may be preformed to form the semiconductor device of FIGS. 1 and 2.

Particularly, a conductive layer may be formed to fill the first opening 171, and a hard mask pattern may be formed on the conductive layer. The conductive layer may be etched using the hard mask pattern as an etching mask to form a bit line structure 146 (refer to FIGS. 1 and 2). Storage node contacts 152 (refer to FIGS. 1 and 2) may be formed on the second and third contact regions 110b and 110c, respectively, and capacitors 160 (refer to FIGS. 1 and 2) may be formed on the storage node contacts 152.

FIGS. 29 to 33 are cross-sectional views and plan views illustrating stages of a method of manufacturing a semiconductor device in accordance with example embodiments.

In example embodiments, the first insulation layer structure 122 may include a single layer.

First, the structure of FIGS. 5 and 6 may be formed by performing processes substantially the same as or similar to those illustrated with reference to FIGS. 3 to 6.

Figure 29:
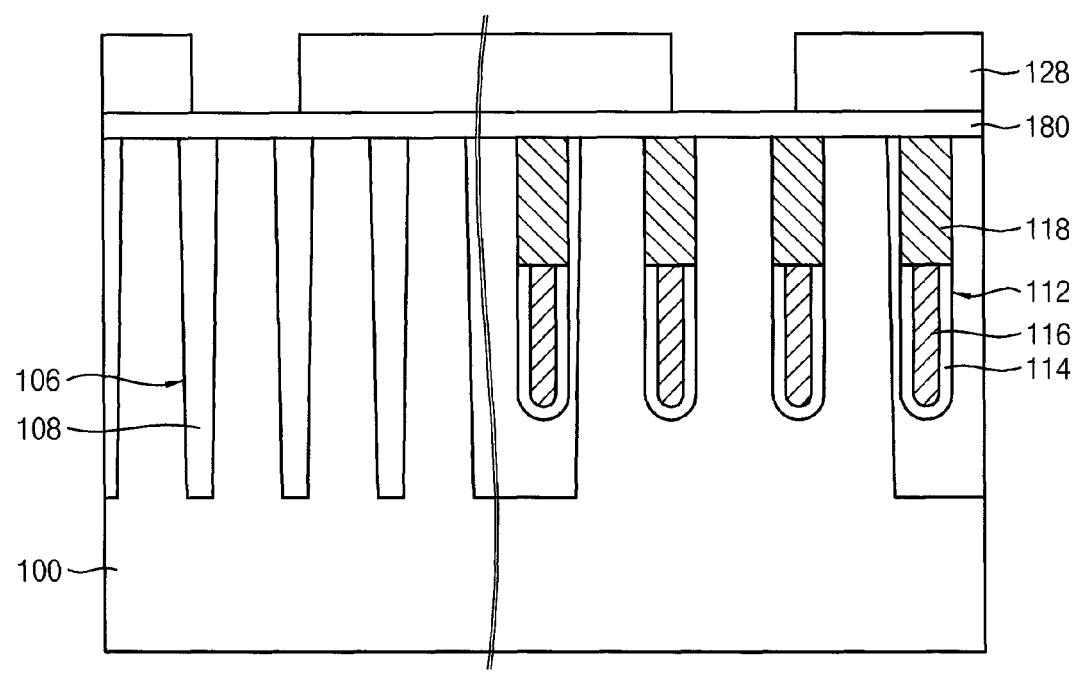
FIGS. 29 to 33 are cross-sectional views and plan views illustrating in a method of manufacturing a semiconductor device in accordance with example embodiments.

Referring to FIG. 29, a first insulation layer 180 may be formed on the substrate 100. The first insulation layer 180 may be formed to include, e.g., silicon oxide.

A photoresist film may be coated on the first insulation layer 180, and may be patterned by a photo process to form a photoresist pattern 128.

In example embodiments, a plurality of photoresist patterns 128 may be formed to have an island shape from each other, and may overlap the second and third contact regions 110b and 110c and a portion of the preliminary isolation pattern 108 adjacent to the second and third contact regions 110b and 110c. That is, the photoresist patterns 128 may be substantially the same as or similar to those illustrated with reference to FIG. 9. Alternatively, the photoresist pattern 128 may include a hole exposing the first contact region 110a, and thus may be substantially the same as or similar to those illustrated with reference to FIG. 25.

Figure 30:
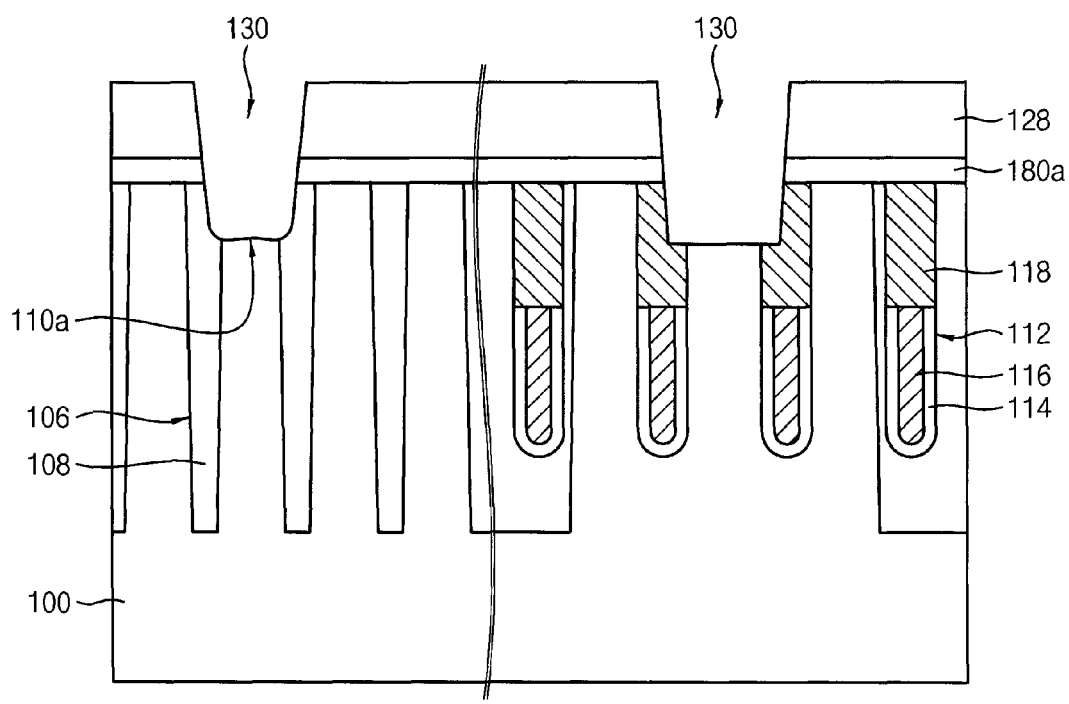

Referring to FIG. 30, the first insulation layer 180 and the substrate 100 may be etched using the photoresist patterns 128 as an etching mask to form a first preliminary opening 130.

By the etching process, a plurality of first insulation patterns 180a each of which may have a pillar shape may be formed on the substrate 100 to cover the second and third regions 110b and 110c. In example embodiments, each of the first insulation patterns 180a may have, e.g., a circular solid cylindrical shape or an elliptical solid cylindrical shape. The first preliminary opening 130 may be formed between the first insulation patterns 180a.

The first preliminary opening 130 may expose the first contact region 110a and an isolation pattern 108 adjacent thereto. The first preliminary opening 130 may have a first width in the first direction. A portion exposed by the first preliminary opening 130 may be substantially the same as that illustrated with reference to FIG. 11.

Figure 31:
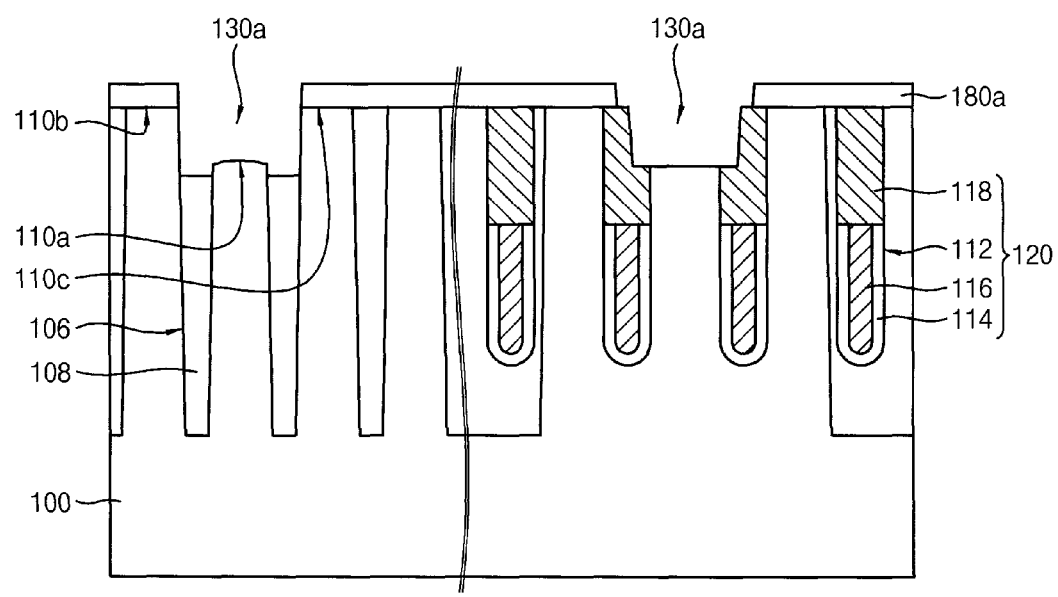

Referring to FIG. 31, the preliminary isolation pattern 108 on the sidewall of the first preliminary opening 130 may be partially etched to form a second preliminary opening 130a. Thus, the active patterns 100a and the buried gate structure 120 may be exposed by a sidewall of the second preliminary opening 130a. The second preliminary opening 130a may have an enlarged width in the first direction. The photoresist patterns 128 may be removed.

Figure 32:
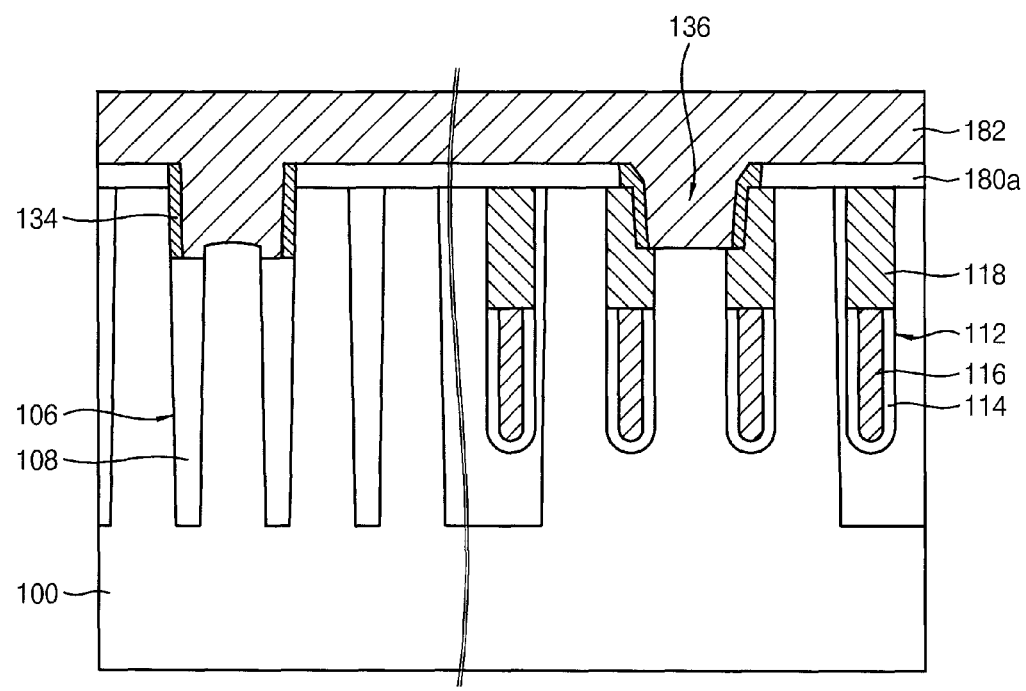

Referring to FIG. 32, an insulation liner may be conformally formed on an inner wall of the second preliminary opening 130a and a surface of the first insulation pattern 180a. The insulation liner may be anisotropically etched to form a second insulation pattern 134 on the sidewall of the second preliminary opening 130a. In plan view, the second insulation pattern 134 may be formed to have a closed line shape. Thus, the second preliminary opening 130a may be transformed into a plurality of first openings 136 having an island shape from each other defined by the insulation pattern 134.

A first conductive layer 182 may be formed on the first and second insulation patterns 180a and 134 to fill the first openings 136.

Figure 33:
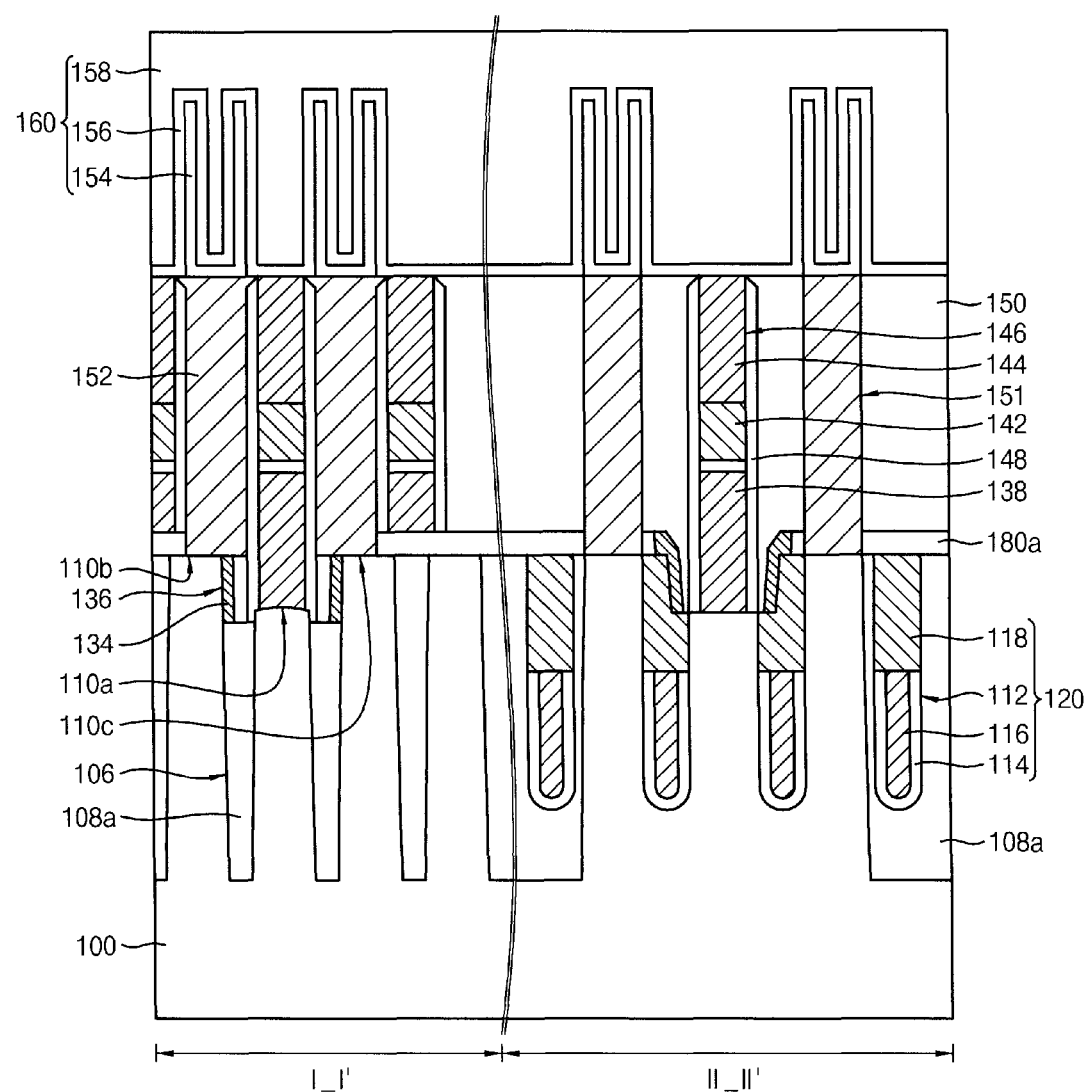

Referring to FIG. 33, a second conductive layer and a second hard mask layer may be formed on the first conductive layer 182. The second hard mask layer may be patterned to form a second hard mask 144.

The second conductive layer and the first conductive layer 182 may be etched using the second hard mask 144 as an etching mask to form a bit line structure 146.

An insulating interlayer 150 may be formed to cover the bit line structure 146. Storage node contacts 152 may be formed on the second and third contact regions 110b and 110c, respectively, through the insulating interlayer 150. Capacitors 160 may be formed on the storage node contacts 152, respectively.

The processes may be substantially the same as or similar to those illustrated with reference to FIGS. 19 to 24.

Figure 34:
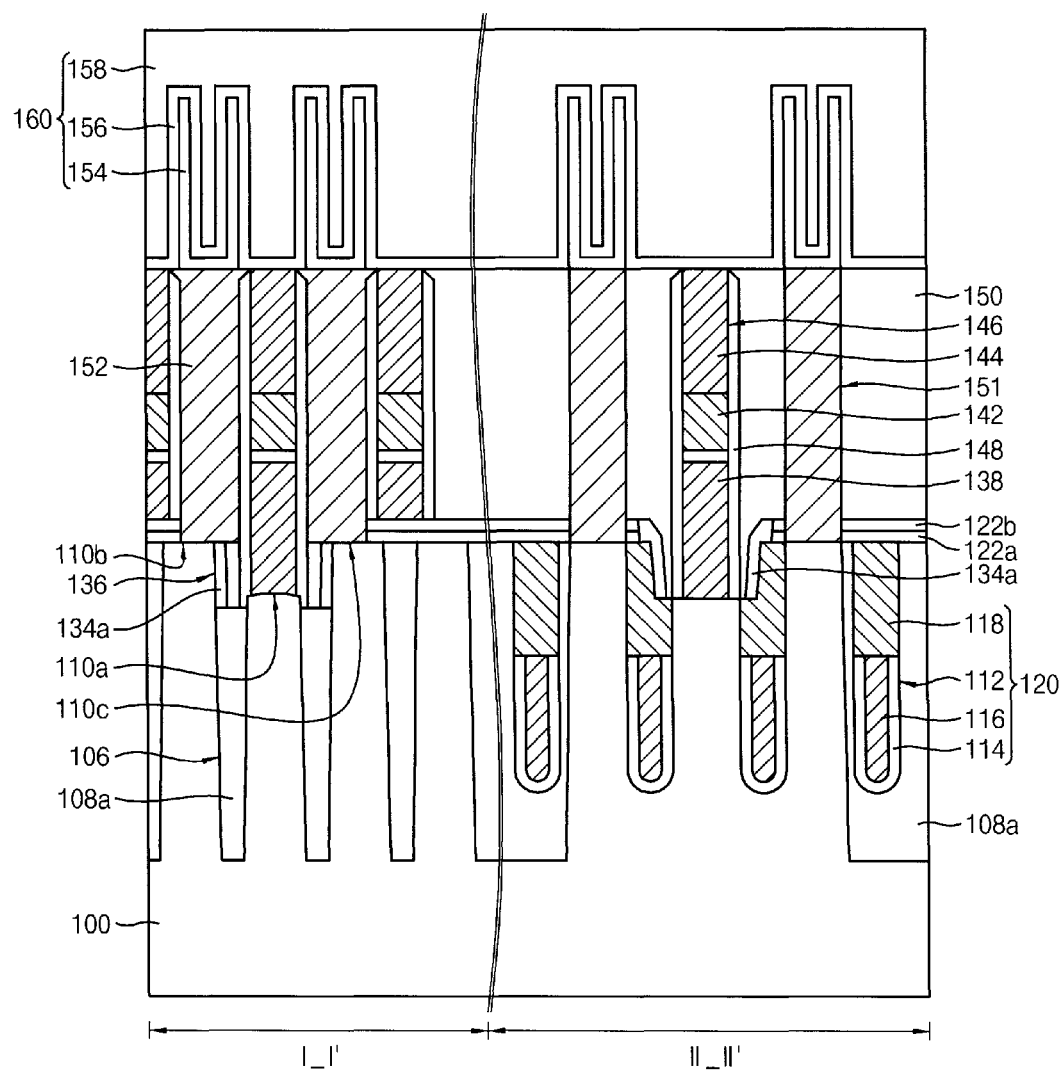
FIGS. 34 and 35 are a cross-sectional view and a plan view illustrating a semiconductor device in accordance with example embodiments.
Figure 35:
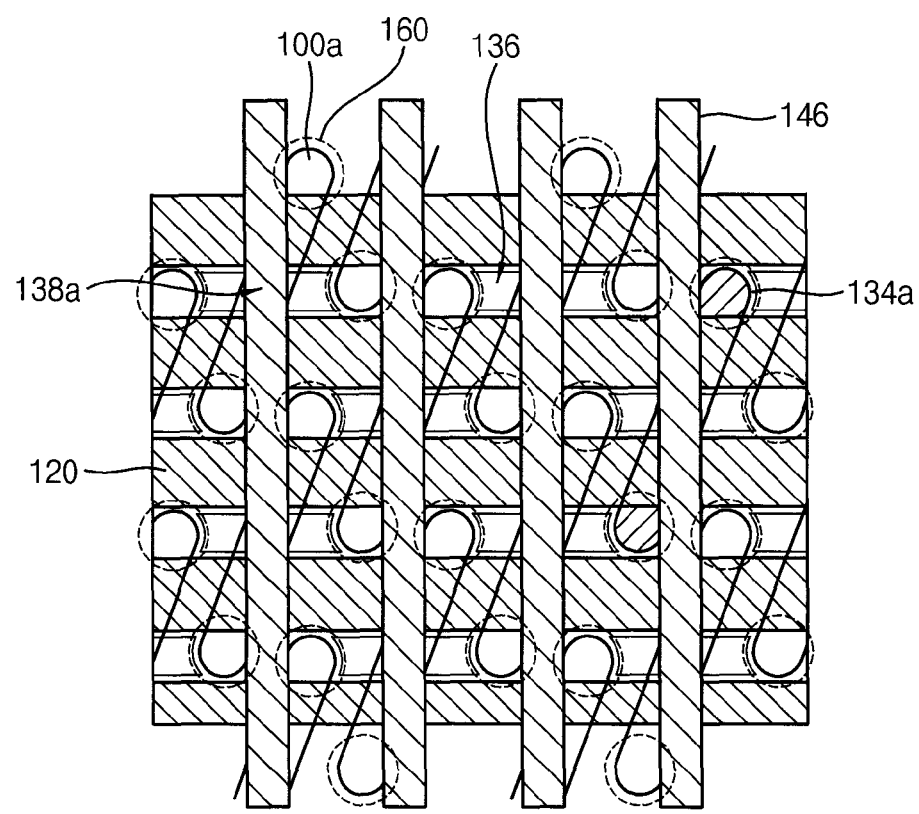

FIGS. 34 and 35 are a cross-sectional view and a plan view illustrating a semiconductor device in accordance with example embodiments.

The semiconductor device may be substantially the same as or similar to that illustrated with reference to FIG. 1, except that semiconductor device has no insulation pattern.

Referring to FIGS. 34 and 35, a first opening 136 may be defined by sidewalls of active patterns 100a and sidewalls of neighboring buried gate structures 120 disposed in the second direction. No insulation pattern may be formed in the first opening 136, and an air gap 134a may be formed in the first opening 136.

The air gap 134a may be formed between a portion of the insulating interlayer 150 on sidewalls of the bit line structure 146 and each of the active patterns 100a in the first opening 136, and between the insulating interlayer 150 and the buried gate structure 120. The air gap 134a may have a closed-line shape. Thus, the air gap 134a may electrically insulate each of the active patterns 100a from the buried gate structure 120.

Figure 36:
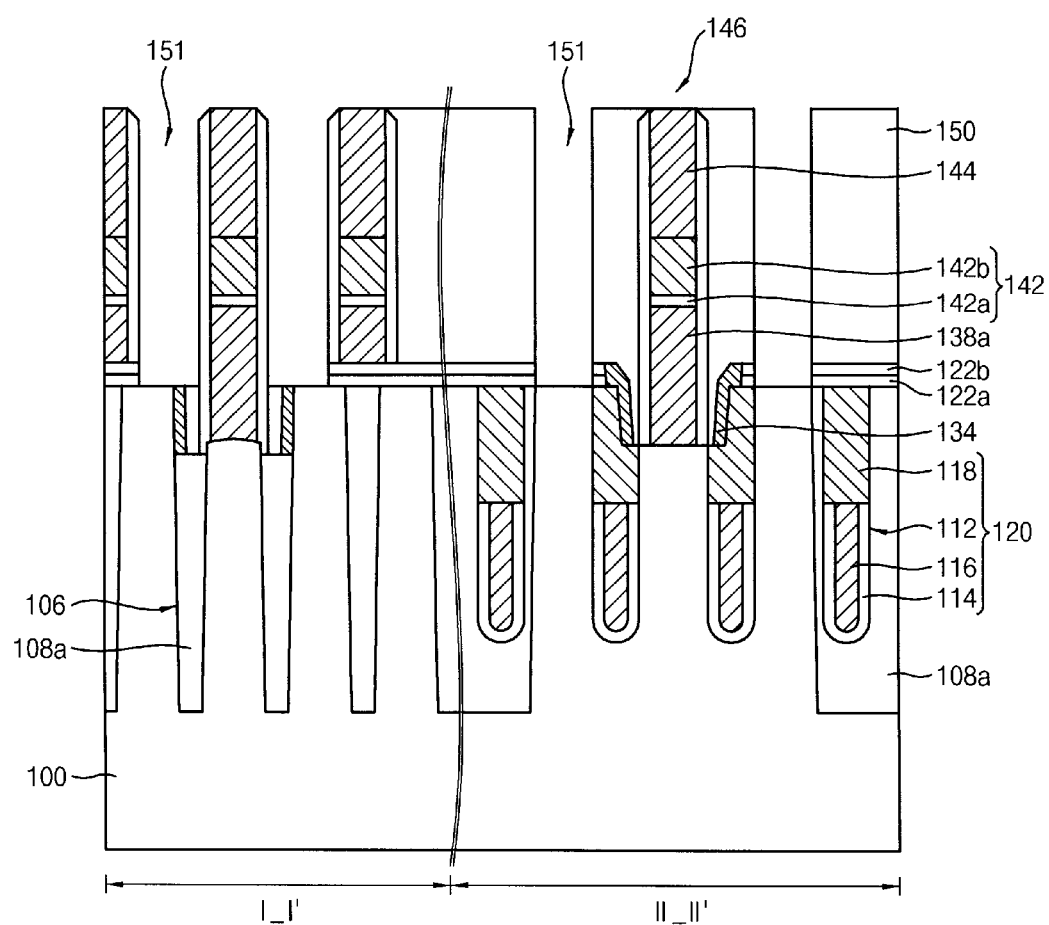
FIGS. 36 to 38 are cross-sectional views illustrating in a method of manufacturing the semiconductor device of FIG. 34.
Figure 37:
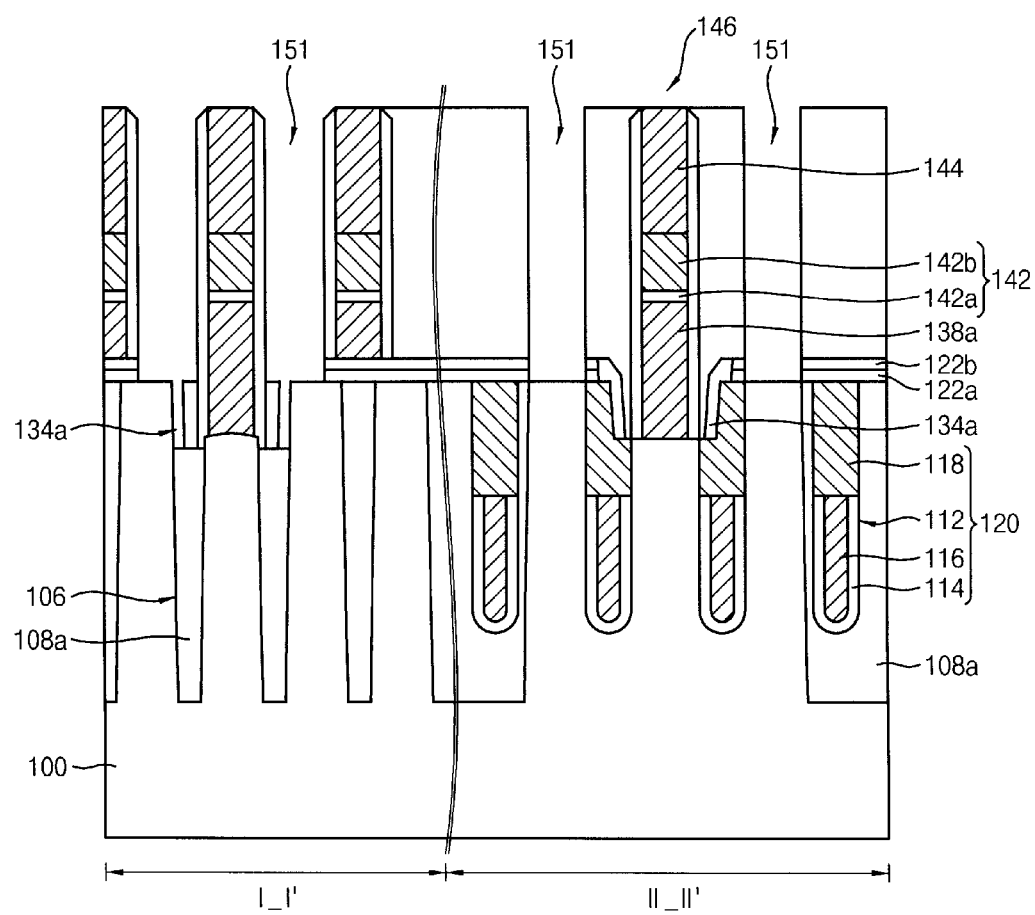
Figure 38:
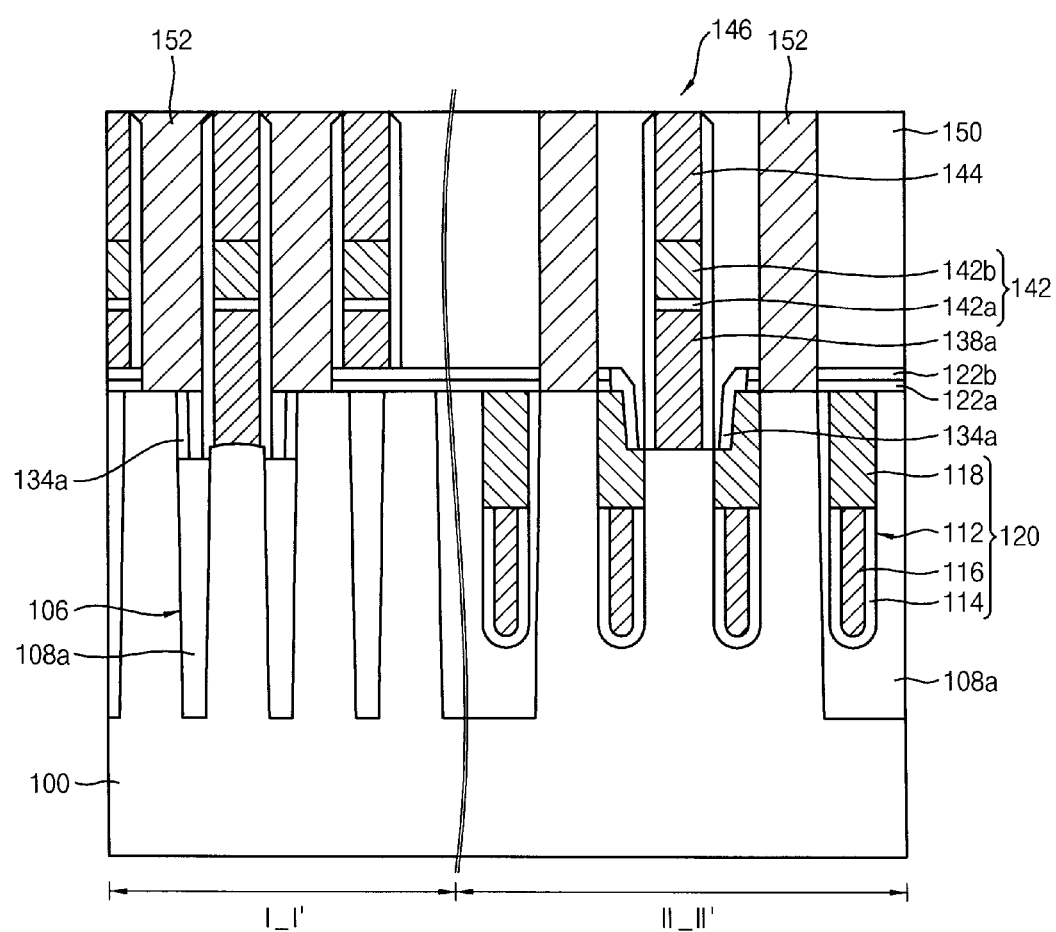

FIGS. 36 to 38 are cross-sectional views illustrating stages of a method of manufacturing the semiconductor device of FIG. 34.

First, the structure of FIG. 21 may be formed by performing processes substantially the same as or similar to those illustrated with reference to FIGS. 3 to 21.

Referring to FIG. 36, spacers 148 including an insulation material may be formed on sidewalls of the bit line structure 146.

An insulating interlayer 150 may be formed to cover the bit line structure 146. The insulating interlayer 150, the etch stop layer 122b and the pad insulation layer 122a may be etched to form storage node contact holes 151 exposing the second and third contact regions 110a and 110b.

Referring to FIG. 37, an insulation pattern 134 exposed by the storage node contact holes 151 may be selectively removed. In example embodiments, each of the storage node contact holes 151 may not expose a material substantially the same as that of the insulation pattern 134, e.g., silicon nitride. Thus, a spacer including silicon oxide may be formed on a sidewall of each of the storage node contact holes 151 to have a thin thickness, before removing the insulation pattern 134.

The removing process may include a wet etching process. During the wet etching process, the insulation pattern 134 not exposed by storage node contact holes 151 may be also etched to form an air gap 134a having a closed line shape.

Referring to FIG. 38, a conductive layer may be formed to fill the storage node contact holes 151 while maintaining the air gap 134a. The conductive layer may be planarized to form storage node contacts 152. In example embodiments, the conductive layer may be formed to include, e.g., polysilicon or a metal.

A capacitor 160 including a lower electrode 154, a dielectric layer 156 and an upper electrode 158 may be formed on each of the storage node contacts 152.

As described above, the semiconductor device of FIG. 34 may be manufactured.

The semiconductor device in accordance with example embodiments may be mounted on a semiconductor package. The semiconductor device and the semiconductor package may be used in various types of electronic devices, such as a computing system.

Figure 39:
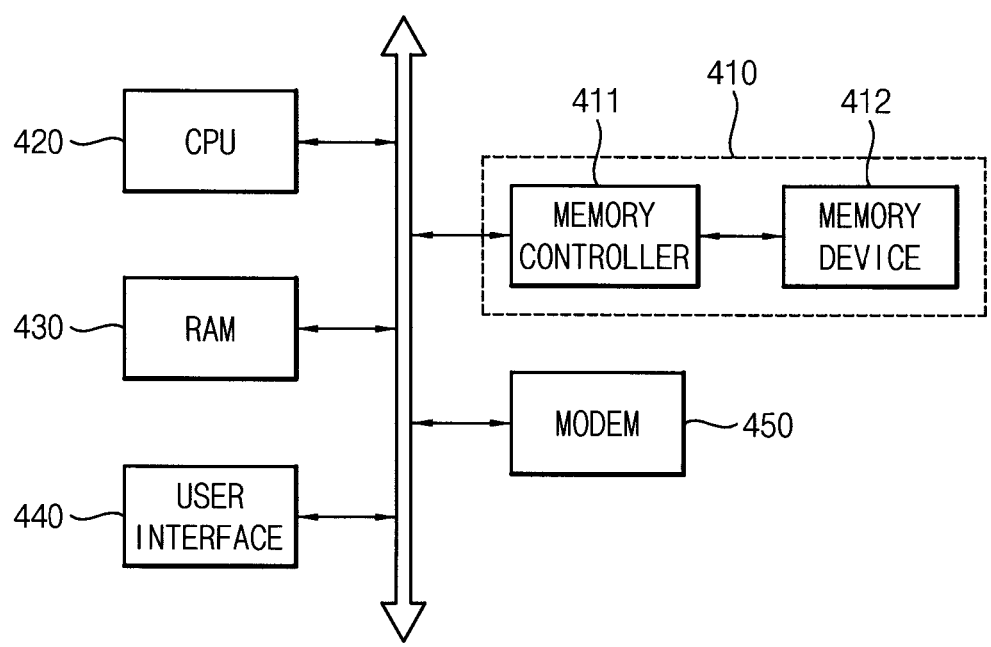
FIG. 39 is a block diagram illustrating a computing system including a semiconductor device in accordance with example embodiments.

FIG. 39 is a block diagram illustrating a computing system including a semiconductor device in accordance with example embodiments.

Referring to FIG. 31, a computing system 400 may include a CPU 420, a RAM 430, a user interface 440, a modem 450 such as a baseband chipset, and a memory system 410, which may be electrically connected to a system bus. The memory system 410 may include a memory device 412 and a memory controller 411. The memory device 412 may include the semiconductor device in accordance with example embodiments described above, e.g., a DRAM device. The memory controller 411 may have a construction capable of controlling the memory device 412. The memory system 410 may be provided as, e.g., a memory card or a solid state disk (SSD) by a combination of the memory device 412 and the memory controller 411. If the computing system 400 may be a mobile device, the computing system 400 may further include a battery for applying of an operating voltage. The computing system 400 may further include an application chipset, a camera image process, mobile DRAM, etc.

As described above, the semiconductor device including a wiring structure having a very small size may be manufactured.

What is claimed is:

1. A method of manufacturing a semiconductor device, the method comprising:
    forming a preliminary isolation pattern to define a plurality of active patterns of a substrate that are spaced apart from each other, each of the active patterns having a first contact region at a central portion thereof and second and third contact regions at edge portions thereof on opposite sides of the central portion, respectively;
    forming buried gate structures in upper portions of the preliminary isolation pattern and the active patterns, each of the buried gate structures extending in a first direction;
    forming a first insulation layer on the preliminary isolation pattern and the active patterns;
    etching away a portion of the first insulation layer on the first contact region of one of the active patterns and an upper portion of the first contact region thereunder to form a preliminary first opening having a bottom at which the first contact region is exposed and sides at which an upper portion of preliminary the isolation pattern defining the first contact region is exposed;
    etching away said upper portion of the preliminary isolation pattern exposed at the sides of the preliminary first opening such that two of the active patterns adjacent to opposites sides of said one of the active patterns, respectively, in the first direction and two of the buried gate structures adjacent one another in a second direction are exposed, and to thereby form a second opening, the second opening exposing a side surface of each of said two of the active patterns in the first direction and exposing said two of the buried gate structures in the second direction;
    forming an insulation pattern along sides of the second opening; and
    forming a wiring structure contacting the first contact region in the second opening.

2. The method of claim 1, wherein the buried gate structures are formed to divide the first, second and the third contact regions from each other in each of the active patterns.

3. The method of claim 1, wherein each of the active patterns extends in a third direction that is not perpendicular to the first direction, and wherein the first contact region of each of the active patterns is disposed in a space delimited by side surfaces of the active patterns and sides of two of the buried gate structures adjacent one another in the second direction, and wherein the second direction is substantially perpendicular to the first direction.

4. The method of claim 1, wherein etching the preliminary isolation pattern exposed at the sides of the preliminary first opening to form the second opening is carried out by an isotropic etching process.

5. The method of claim 1, wherein forming the insulation pattern includes:
    forming a second insulation layer along surfaces defining the second opening and on the first insulation layer to electrically insulate the active patterns from the buried gate structures; and
    anisotropically etching the second insulation layer.

6. The method of claim 5, wherein the second insulation layer is formed of silicon nitride, silicon oxynitride or silicon oxide.

7. The method of claim 1, further comprising forming a first conductive layer on the first insulation layer.

8. The method of claim 1, wherein forming the wiring structure includes:
    forming a conductive layer to fill the second opening; and
    etching away one part of the conductive layer while leaving a remaining part of the conductive layer as the wiring structure inside the second opening.

9. The method of claim 1, wherein an upper portion of the wiring structure is formed to have a linear shape extending in the second direction and the second direction is substantially perpendicular to the first direction.

10. The method of claim 1, wherein forming the preliminary first opening includes:
    forming an etching mask having segments that are spaced apart from each other on the first insulation layer, each of the segments overlapping the second and third contact regions of respective ones of the active patterns adjacent to one another in the first direction and a portion of the isolation pattern adjacent to the second and third contact regions; and
    etching the first insulation layer using the etching masks.

11. The method of claim 1, wherein forming the preliminary first opening includes:
    forming an etching mask on the first insulation layer, the etching mask having a hole therethrough exposing the first contact region of each of the active patterns; and
    etching the first insulation layer using the etching mask.

12. The method of claim 1, wherein the insulation pattern is formed in the second opening directly on the side surfaces of said two of the active patterns exposed in the first direction and directly on the two buried gate structures exposed in the second direction.

13. A method of manufacturing a semiconductor device, the method comprising:
    forming a preliminary isolation pattern to define a plurality of active patterns of a substrate, each of the active patterns including a contact region;
    forming buried gate structures in upper portions of the active patterns and the preliminary isolation pattern, each of the buried gate structures extending in a first direction;
    forming a first insulation layer on the preliminary isolation pattern and the active patterns;
    etching away a portion of the first insulation layer on the contact region of a respective one of the active regions and an upper portion of the contact region thereunder to form a preliminary first opening having a bottom at which the contact region is exposed and sides at which an upper portion of preliminary the isolation pattern defining the contact region is exposed;
    subsequently performing an isotropic etching process to etch an upper portion of the isolation pattern exposed at the sides of the preliminary first opening and to thereby form a second opening, the second opening having a width in the first direction greater than that of the preliminary first opening at a level of an upper surface of the contact region;
    forming an insulation pattern along sides of the second opening; and
    forming a wiring structure contacting the contact region in the second opening.

14. The method of claim 13, wherein the isotropic etching process of etching the upper portion of the isolation pattern exposed at the sides of the preliminary first opening to form the second opening etches away the upper portion of the isolation pattern so that a side surface of each of two of the active patterns adjacent opposite sides of said one of the active patterns, respectively, in the first direction are exposed at opposite sides of the second opening.

* * * * *